US009462237B2

(12) United States Patent
Koshiba et al.

(10) Patent No.: US 9,462,237 B2
(45) Date of Patent: Oct. 4, 2016

(54) PIXEL CORRECTION METHOD AND IMAGE CAPTURE DEVICE

(71) Applicant: FUJIFILM Corporation, Tokyo (JP)

(72) Inventors: Masaaki Koshiba, Saitama (JP);
Kazufumi Sugawara, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/752,287

(22) Filed: Jun. 26, 2015

(65) Prior Publication Data

US 2015/0319412 A1 Nov. 5, 2015

Related U.S. Application Data

(63) Continuation of application No. PCT/JP2013/084023, filed on Dec. 19, 2013.

(30) Foreign Application Priority Data

Dec. 28, 2012 (JP) ................. 2012-287317

(51) Int. Cl.
*H04N 9/09* (2006.01)
*H04N 5/369* (2011.01)
*H04N 5/347* (2011.01)
(Continued)

(52) U.S. Cl.
CPC .......... *H04N 9/045* (2013.01); *H01L 27/1464* (2013.01); *H01L 27/14603* (2013.01); *H01L 27/14621* (2013.01); *H01L 27/14623* (2013.01); *H04N 5/23212* (2013.01); *H04N 5/347* (2013.01); *H04N 5/35563* (2013.01); *H04N 5/367* (2013.01); *H04N 5/369* (2013.01);
(Continued)

(58) Field of Classification Search
None
See application file for complete search history.

(56) References Cited

U.S. PATENT DOCUMENTS

2006/0238629 A1* 10/2006 Sato ................ H04N 5/367
348/241
2007/0154200 A1* 7/2007 Utagawa ............ H04N 9/045
396/111
(Continued)

FOREIGN PATENT DOCUMENTS

JP 2010-62640 A 3/2010
JP 2011-7882 A 1/2011
(Continued)

OTHER PUBLICATIONS

Machine Translation of JP2011250325, Retrieved Jun. 2, 2016.*
(Continued)

*Primary Examiner* — Albert Cutler
(74) *Attorney, Agent, or Firm* — Birch, Stewart, Kolasch & Birch, LLP

(57) ABSTRACT

A color image sensor comprises normal pixels and phase difference pixels. A pixel combining circuit combines pixel signals of the normal pixels, and combines pixel signals of the normal pixel and the phase difference pixel of the same color. Thereby the pixel combining circuit produces a composite image. An edge detector uses a pixel signal of each pixel in the composite image to detect an edge of a subject. The edge is vertical to a direction in which a difference between the pixel signals is at the maximum. A pixel signal correction processor corrects the combined pixel signals through interpolation along the edge and with the use of pixel signals of the same color obtained by combining the pixel signals of the normal pixels in a case where the pixel signals of the phase difference pixels are combined across the edge.

11 Claims, 16 Drawing Sheets

(51) Int. Cl.
*H04N 5/355* (2011.01)
*H04N 5/367* (2011.01)
*H04N 5/232* (2006.01)
*H04N 9/07* (2006.01)
*H01L 27/146* (2006.01)
*H04N 9/04* (2006.01)

(52) U.S. Cl.
CPC .............. *H04N5/3696* (2013.01); *H04N 9/07* (2013.01); *H04N 2209/046* (2013.01)

(56) References Cited

U.S. PATENT DOCUMENTS

| | | | |
|---|---|---|---|
| 2011/0109775 A1 | 5/2011 | Amano | |
| 2012/0133813 A1* | 5/2012 | Nagano | H04N 5/3696 348/311 |
| 2012/0193515 A1* | 8/2012 | Agranov | G01S 3/782 250/208.1 |
| 2012/0229696 A1* | 9/2012 | Hashimoto | G02B 7/36 348/360 |
| 2012/0236185 A1* | 9/2012 | Ishii | G02B 7/34 348/345 |
| 2013/0201383 A1* | 8/2013 | Okado | G02B 7/34 348/345 |

FOREIGN PATENT DOCUMENTS

| | | |
|---|---|---|
| JP | 2011-250325 A | 12/2011 |
| JP | 2012-4729 A | 1/2012 |

OTHER PUBLICATIONS

International Search Report, issued in PCT/JP2013/084023, dated Mar. 18, 2014.
Written Opinion of the International Searching Authority, issued in PCT/JP2013/084023, dated Mar. 18, 2014.

* cited by examiner

PIXEL CORRECTION METHOD AND IMAGE CAPTURE DEVICE

CROSS-REFERENCE TO RELATED APPLICATIONS

This application is a Continuation of PCT International Application No. PCT/JP2013/084023 filed on Dec. 19, 2013, which claims priority under 35 U. S. C. §119 (a) to Japanese Patent Application No. 2012-287317, filed Dec. 28, 2012. Each of the above application(s) is hereby expressly incorporated by reference, in its entirety, into the present application.

BACKGROUND OF THE INVENTION

1. Field of the Invention

The present invention relates to a method for correcting defective combined pixel signals generated from pixel signals of phase difference pixels used for focus detection and an image capture device.

2. Description Related to the Prior Art

An autofocusing (AF) function for performing automatic focus adjustment has become a standard feature of image capture devices such as digital cameras and surveillance cameras. Autofocusing functions include a contrast AF operation that performs focus adjustment to make the contrast of the image maximum and a phase detection AF operation that performs the focus adjustment based on a phase difference caused by parallax. The contrast AF operation requires finding an inflection point of the contrast while a taking lens is moved, whereas the phase detection AF operation enables fast autofocusing because it detects the focus state at each lens position.

The image capture device which adopted the phase detection AF operation uses an image sensor (solid-state imaging device) which has pixels (hereinafter referred to as the normal pixels) of symmetrical structure and pixels (hereinafter referred to as the phase difference pixels) of asymmetrical structure used for focus detection. The normal pixels are used for obtaining pixel signals (pixel values) for producing an image (normal image) taken in the normal mode. The phase difference pixels are used for obtaining information of phase difference used for the phase difference AF operation. The phase difference pixel has an opening at the position shifted to the left or right relative to that of the normal pixel, and selectively receives light incident on a right portion or a left portion of a photodiode.

In the case where the taking lens is set in the focusing position, the waveform of the pixel signal read out from the right phase difference pixel group for receiving the light from the right side coincides with the waveform of the pixel signal read out from the left phase difference pixel group for receiving the light from the left side, and there is no phase difference between them. In the case where the taking lens is out of the focusing position, a phase difference appears in the waveforms of the two pixel signals in accordance with defocus. The sequences of the phases of the two pixel signal waveforms which correspond to the front and rear focuses, respectively, differ from each other. Therefore the information of the phase difference is extracted to set the taking lens to the focusing position.

It is common for the image sensor having the phase difference pixels to produce the normal image with the use of the phase difference pixels in addition to the normal pixels because pixel missing occurs at the positions corresponding to the phase difference pixels in the normal image in the case where the normal image is produced based only on the pixel signals from the normal pixels. However, the pixel signals obtained, without correction, from the phase difference pixels cannot be used as the pixel signals for the normal image because the sensitivity and the like of the phase difference pixels differ from those of the normal pixels. In order to produce the normal image, the pixel having the pixel signal obtained from the phase difference pixel is treated as a defective pixel and the pixel signal is subjected to a correction process. For example, in the case of a color normal image, a method (hereinafter referred to as the interpolation correction) for generating a corrected pixel signal through interpolation using the pixel signals of the adjacent normal pixels of the same color and a method (hereinafter referred to as the gain correction) for multiplying the pixel signal of the phase difference signal by a gain are known (see Japanese Patent Laid-Open Publication Nos. 2012-004729 and 2011-007882, and U. S. Patent Application Publication No. 2011/0109775 (corresponding to Japanese Patent Laid-Open Publication No. 2010-062640)).

The interpolation correction works well with an inconspicuous trace of the correction in the case where a change in a subject is small at around the phase difference pixel. The gain correction works well in the case where a change in a subject is large at around the phase difference pixel. In order to correct the pixel signal of the phase difference pixel, a proper correction method is selected in accordance with the characteristics of the subject located at or around the phase difference pixel.

For example, in the Japanese Patent Laid-Open Publication No. 2012-004729, a change (edge) in a subject at around the phase difference pixel is detected, and the suitable one of the interpolation correction and the gain correction is used in consideration of a gamma correction process performed afterwards. In the Japanese Patent Laid-Open Publication No. 2011-007882, a change (or the direction of a change) in a subject is detected at around the phase difference pixel, and then the suitable one of the interpolation correction and the gain correction is selected. In particular, in the case where the pixel signal of the phase difference signal is corrected through the interpolation correction, it is disclosed that only the normal pixels located in the direction of the change in the subject are used. In the U.S. Patent Application Publication No. 2011/109775, weights of certain proportions are assigned to the pixel signal obtained through the interpolation correction and the pixel signal obtained through the gain correction, respectively, and then the pixel signals are summed. Thereby a corrected pixel signal is obtained. The proportions of the weights are changed based on the change (or uniformity), in the subject, at around the phase difference pixel.

A recent image capture device which executes a normal mode in which a normal image with high resolution is produced and a pixel combining mode that allows imaging with high sensitivity despite the low resolution has been known (see Japanese Patent Laid-Open Publication No. 2011-250325). In the pixel combining mode, the pixel signals of two or more pixels are combined with each other to generate a pixel signal of one combined pixel. Combining the pixel signals is referred to as a pixel addition process or a pixel combining process.

In the pixel combining mode, a composite image is produced by combining the pixel signals under a certain rule. For example, the color image sensor combines the pixel signals of two pixels disposed side by side in a certain direction, out of the pixels of the same color disposed close to each other. In the case where this pixel combining process is applied to the phase difference pixel in a like manner, there are three patterns of combinations, depending on the arrangement of the phase difference pixels: a normal pixel and another normal pixel; a normal pixel and a phase difference pixel; a phase difference pixel and another phase difference pixel. In the two patterns in which the pixel signal of the phase difference pixel is added (excluding the pattern in which the normal pixels are combined with each other) out of the three patterns of the combinations, a new combined pixel that is generated by the pixel combining process is a defective combined pixel, so that the correction of the pixel signal thereof is necessary. In other words, in the color image sensor having the phase difference pixels, the number of the defective combined pixels in the pixel combining mode is greater than the number of the phase difference pixels, being the defective pixels, in the normal image. Therefore the pixel combining mode requires a long time to correct the pixel signals as compared with the normal mode. In the Japanese Patent Laid-Open Publication No. 2011-250325, the arrangement of the phase difference pixels in the color image sensor is improved such that the pixel combining process which involves the phase difference pixel is performed by combining the phase difference pixels of the same color. Thus, there are only two patterns of combinations: a normal pixel and another normal pixel; a phase difference pixel and another phase difference pixel.

In the case where the phase difference pixels are disposed consecutively in the image sensor, the pixel signals from the phase difference pixels may not be corrected accurately in the image data (data composed of the pixel signals of one frame) of the normal image. For example, in the case where the interpolation correction is suitable for correcting the pixel signals of the phase difference pixels, the pixel signals of the normal pixels adjacent to the phase difference pixels are used. In the case where the phase difference pixels are disposed consecutively, the normal pixels necessary for the interpolation correction may be in short supply or the direction in which accurate interpolation is allowed may be limited. As a result, the correction accuracy may be degraded and the trace of the correction may become conspicuous.

In the normal mode, in order to ensure the accuracy of the interpolation correction, it is preferred that, at least, all of the pixels of the same color disposed in the closest proximity to the phase difference pixel are the normal pixels. This means that one or more normal pixels of the same color as that of the phase difference pixel are disposed between the phase difference pixels. In this case, however, the pixel signal of the phase difference pixel is combined with the pixel signal of the normal pixel in the pixel combining mode.

Since a pixel which is based on the pixel signal obtained from the phase difference pixel is a defective pixel, a pixel which is based on the pixel signal obtained by combining the pixel signal of the phase difference pixel with the pixel signal of the normal pixel is a defective combined pixel. In this case, the number of the defective combined pixels is increased, resulting in long correction time. Characteristics of the defective combined pixel differ from those of the defective pixel that is based on the phase difference pixel. The pixel signal of the defective combined pixel cannot be corrected accurately by the same method as that for correcting the phase difference pixel. For example, in a composite image obtained in the pixel combining mode, the pixel signal of the defective combined pixel, which is obtained by combining the pixel signal of the phase difference pixel with the pixel signal of the normal pixel across the edge (the boundary across which the pixel signal changes abruptly) of the subject requires long correction time. Furthermore, even if the interpolation correction and the gain correction for correcting the pixel signal of the phase difference pixel are applied to the defective combined pixel, the result of the correction often turns out to be inaccurate.

To prevent the above-described problems, in the Japanese Patent Laid-Open Publication No. 2011-250325, the arrangement of the phase difference pixels is improved to inhibit combining the pixel signal of the normal pixel with the pixel signal of the phase difference pixel. However, it is impossible to inhibit combining the pixel signal of the normal pixel with the pixel signal of the phase difference pixel. Therefore it is required to accurately correct the pixel signal of the defective combined pixel, which is generated by combining the pixel signal of the normal pixel and the pixel signal of the phase difference pixel.

SUMMARY OF THE INVENTION

An object of the present invention is to provide a method for accurately correcting a pixel signal of a defective combined pixel which is generated by combining a pixel signal of a normal pixel and a pixel signal of a phase difference pixel and an image capture device.

An image capture device of the present invention comprises a color image sensor, a pixel combining unit, an edge detector, and a corrector. The color image sensor has a plurality of normal pixels and two or more phase difference pixels. The normal pixel isotropically receives incident light. The phase difference pixel selectively receives a part of the incident light. The pixel combining unit performs a same type combining process and a different type combining process to produce a composite image. In the same type combining process, first pixel signals from the normal pixels of the same color are combined with each other or second pixel signals from the phase difference pixels of the same color are combined with each other, to generate a first combined signal. In the different type combining process, the first pixel signal and at least one of the second pixel signals of the same color are combined to generate a second combined signal. The composite image is composed of a first combined pixel that is based on the first combined signal and a second combined pixel that is based on the second combined signal. The edge detector detects an edge of a subject by detecting a first direction in which a difference between the first pixel signal and the second pixel signal of the same color or a difference between the first combined signal and the second combined signal of the same color is at a maximum. The edge is vertical to the first direction. The corrector corrects the second combined signal of the second combined pixel through an interpolation process using the first combined signal of the first combined pixel in a case where the different type combining process is performed across the edge, the first combined pixel being disposed in a second direction which is along the edge and vertical to the first direction, the first combined pixel having the same color as the second combined pixel to be corrected.

It is preferred that there are at least three types of the normal pixels corresponding three primary colors, respectively. There is at least one type of the phase difference pixels corresponding to one of the three primary colors.

It is preferred that the corrector calculates an average value of the first combined signals of the first combined pixels and replaces the second combined signal of the second combined pixel to be corrected, with the average value. The first combined pixels are disposed in a second direction which is along the edge and vertical to the first direction. The first combined pixels have the same color as the second combined pixel to be corrected.

It is preferred that the pixel combining unit generates the first combined signal through combining the four first pixel signals of the same color or the four second pixel signals of the same color in the same type combining process, and generates the second combined signal through combining four of the first and second pixel signals including at least a pair of the first and second pixel signals in the different type combining process.

It is preferred that the pixel combining unit generates the first combined signal through combining the two first pixel signals of the same color or the two second pixel signals of the same color in the same type combining process, and generates the second combined signal through combining the one first pixel signal with the one second pixel signal in the different type combining process.

It is preferred that the edge detector calculates the difference in each of a specific direction extending between the normal pixel for generating the first pixel signal and the phase difference pixel for generating the second pixel signal and another direction vertical to the specific direction, and the first pixel signal and the second pixel signal are combined in the different type combining process.

It is preferred that, in order to calculate the difference, the edge detector uses the first combined signals of the first combined pixels disposed opposite to each other with respect to the second combined pixel to be corrected.

It is preferred that the color image sensor has a first pixel group, in which the plurality of pixels are arranged in a square matrix, and a second pixel group, in which the plurality of pixels are arranged in a square matrix at the same arrangement pitch as the first pixel group. The pixels in the second pixel group are disposed in positions obliquely shifted from positions of the pixels in the first pixel group, respectively. The first pixel group and the second pixel group are provided with color filters of the same color arrangement.

It is preferred that the phase difference pixel of the first pixel group and the phase difference pixel of the second pixel group are of the same color and adjacent to each other in an oblique direction.

It is preferred that every fourth pixel in row direction and column direction of each of the square matrices is the phase difference pixel, and the normal pixel of the same color and the same pixel group as the phase difference pixel is disposed between the phase difference pixels.

A pixel correction method comprises an imaging step, a pixel combining step, an edge detecting step, and a correcting step. In the imaging step, a subject is imaged with a color image sensor having a plurality of normal pixels and two or more phase difference pixels. The normal pixel isotropically receives incident light. The phase difference pixel selectively receives a part of the incident light. In the edge detecting step, a same type combining process and a different type combining process are performed to produce a composite image. In the same type combining process, first pixel signals from the normal pixels of the same color are combined with each other or second pixel signals from the phase difference pixels of the same color are combined with each other, to generate a first combined signal. In the different type combining process, the first pixel signal and at least one of the second pixel signals of the same color are combined with each other to generate a second combined signal. The composite image is composed of a first combined pixel that is based on the first combined signal and a second combined pixel that is based on the second combined signal. In the edge detecting step, an edge of the subject is detected by detecting a first direction in which a difference between the first pixel signal and the second pixel signal of the same color or a difference between the first combined signal and the second combined signal of the same color is at a maximum. The edge is vertical to the first direction. In the correcting step, the second combined signal of the second combined pixel is corrected through an interpolation process using the first combined signal of the first combined pixel in a case where the different type combining process is performed across the edge. The first combined pixel is disposed in a second direction which is along the edge and vertical to the first direction. The first combined pixel has the same color as the second combined pixel to be corrected.

According to the present invention, the same type combining process, in which the pixel signals of the normal pixels of the same color are combined with each other, and the different type combining process, in which the pixel signals of the phase difference pixel and the normal pixel of the same color are combined with each other, are performed. A direction in which the difference between the pixel signals is at the maximum is detected to detect the edge of the subject. In the case where the different type combining process is performed across the edge, the pixel signal of the second combined pixel, being the defective combined pixel, is corrected through the interpolation process using the pixel signals of the first combined pixels of the same color which exist in the direction of the edge. Thus, the pixel signal of the second combined pixel is corrected properly.

BRIEF DESCRIPTION OF THE DRAWINGS

The above and other objects and advantages of the present invention will be more apparent from the following detailed description of the preferred embodiments when read in connection with the accompanied drawings, wherein like reference numerals designate like or corresponding parts throughout the several views, and wherein.

DESCRIPTION OF THE PREFERRED EMBODIMENTS

Figure 1:
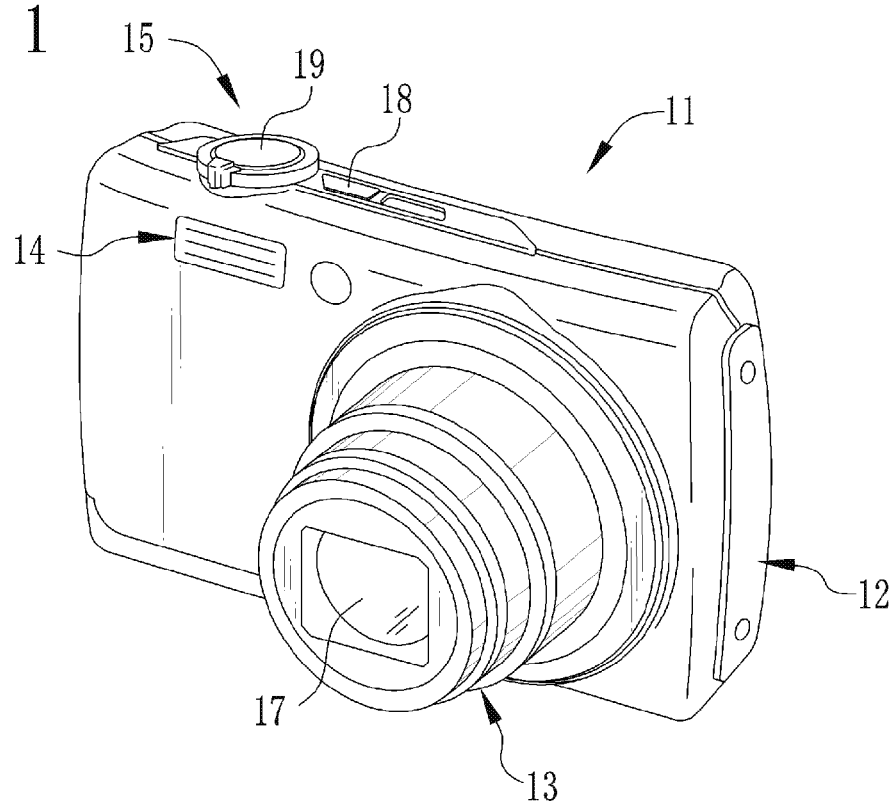
FIG. 1 is a perspective view of a digital camera seen from its front side.
Figure 2:
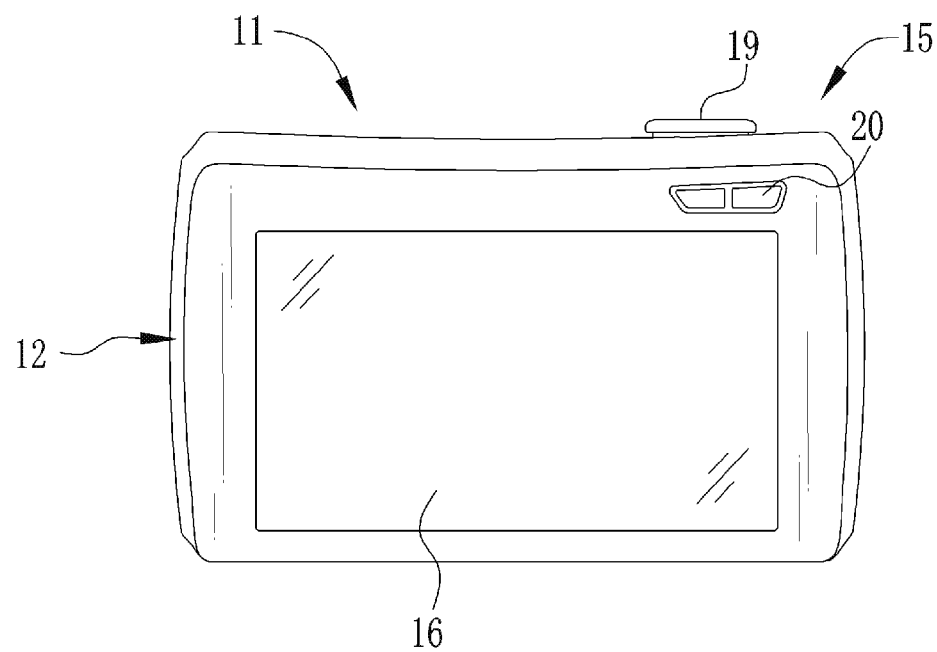
FIG. 2 is a back view of the digital camera.

FIGS. 1 and 2 illustrate a digital camera 11 as an example of an image capture device. The digital camera 11 comprises a camera body 12 and a lens barrel 13. The camera body 12 comprises a flash emitter 14, an operation unit 15, and a display section 16. The lens barrel 13 is provided on the front face of the camera body 12 and holds a taking lens 17.

The flash emitter 14 is provided on the front face of the camera body 12. In a low-luminance automatic flash mode and an always-on mode, the flash emitter 14 applies light to a subject in synchronization with image capture. The operation unit 15 comprises a power switch 18, a release button 19, a mode selection button 20, and the like. The power switch 18 is operated to turn the power of the digital camera 11 on or off.

The release button 19 is pressed to execute imaging. The release button 19 is a two-step down switch composed of an S1 switch (which is to be half-pressed), and an S2 switch (which is to be fully pressed). Upon turning on the S1 switch in response to half-pressing of the release button 19, the digital camera 11 automatically performs the focus adjustment and calculation of an exposure amount. In response to turning on the S2 switch, the imaging is performed based on the exposure amount in the imaging mode chosen (set).

The mode selection button 20 is operated to switch the operation mode of the digital camera 11. The operation modes of the digital camera 11 include a still image capture mode for taking still images, a movie capture mode for taking movies, a reproduction mode for reproducing and displaying the taken still images or movies on the display section 16, and the like. The still image capture mode includes a normal mode for producing a normal image with high resolution, a pixel combining mode for producing a composite image with high sensitivity, a wide dynamic range mode for producing an image with a wide dynamic range, and the like.

The display section 16 is composed of a liquid crystal display and the like provided on the back face of the camera body 12. The images taken in various imaging modes, a menu screen for performing settings, or the like are displayed.

Figure 3:
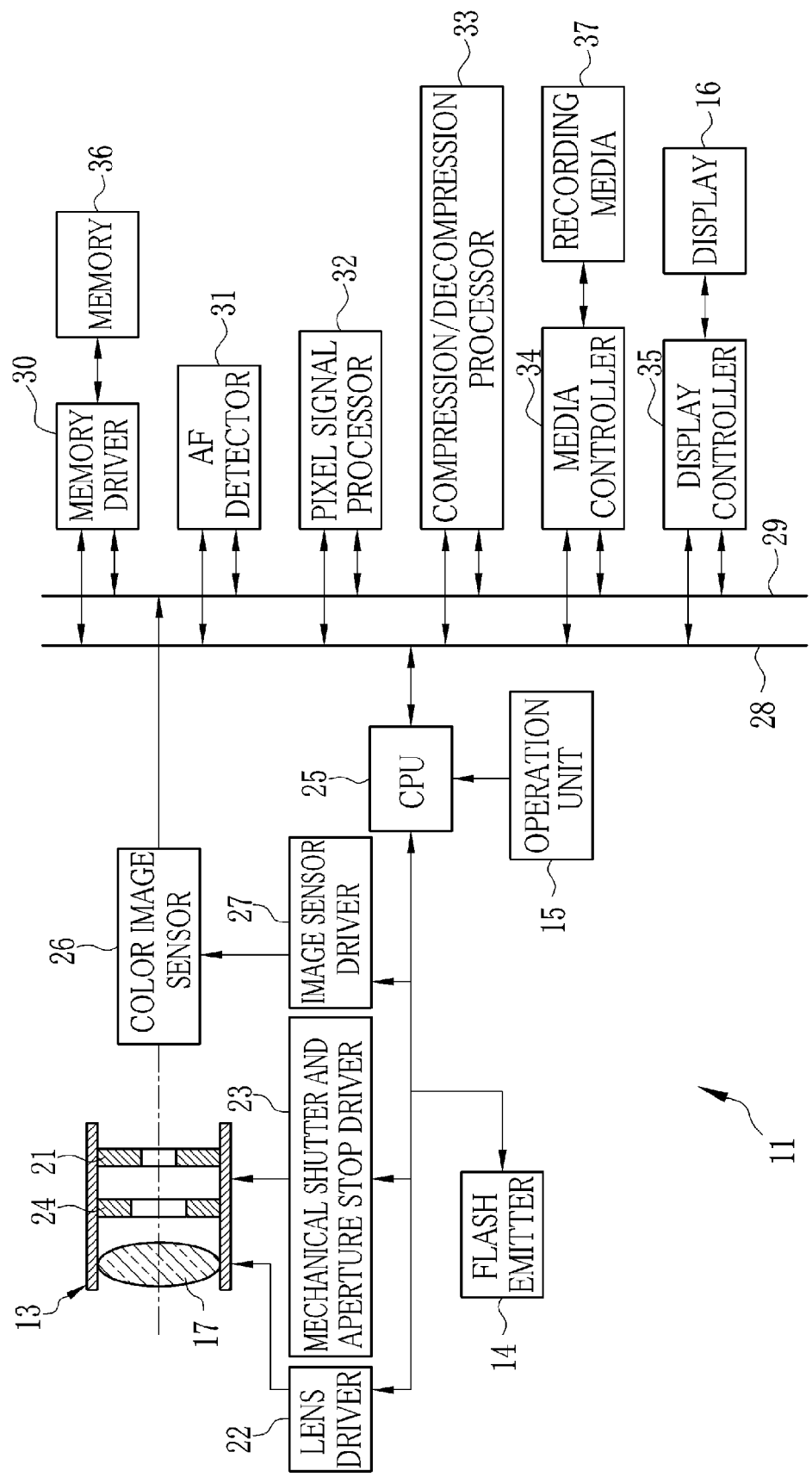
FIG. 3 is a block diagram illustrating electric configuration of the digital camera.

As illustrated in FIG. 3, the taking lens 17, a mechanical shutter 24, an aperture stop 21, and the like are provided in the lens barrel 13. In FIG. 3, the taking lens 17 is schematically depicted with one optical lens, but actually has two or more optical lenses such as a focusing lens for focus adjustment and a variable power lens for adjusting the focal length. The lens barrel 13 is provided with a lens driver 22 and a mechanical shutter and aperture stop driver 23. The lens driver 22 moves each optical lens of the taking lens 17 to adjust the position of each optical lens in an optical axis direction. The mechanical shutter and aperture stop driver 23 opens or shuts the mechanical shutter 24 and adjusts the aperture size of the aperture stop 21.

A color image sensor 26 is provided on the light exit side of the lens barrel 13. The color image sensor 26 is a color single CMOS solid-state imaging device. The color image sensor 26 has a light receiving area 40a (see FIG. 4) on which an image of a subject is formed. A plurality of normal pixels and a plurality of phase difference pixels are arranged in a matrix in the light receiving area 40a. The color image sensor 26 is driven by an image sensor driver 27, and one color pixel signal (hereinafter simply referred to as the pixel signal) is read out from each pixel. The pixel signals of one frame are digitally converted into image data (the so-called RAW data). The RAW data corresponds to the imaging mode chosen by operating the mode selection button 20. For example, the RAW data outputted in the normal mode is composed of the pixel signals outputted from the respective pixels of the image sensor 26. In the pixel combining mode, the RAW data is composed of pixel signals in which the pixel signals of the respective pixels of the image sensor 26 are combined based on a specific rule.

A CPU 25 controls the digital camera 11 based on operation signals inputted from the operation unit 15. For example, the CPU 25 controls the operations of the lens driver 22, the mechanical shutter and aperture stop driver 23, and the image sensor driver 27. The CPU 25 controls the flash emitter 14 to flash in synchronization with imaging.

The CPU 25 is connected to a control bus 28, and controls a memory controller 30, an AF detector 31, a pixel signal processor 32, a compression/decompression processor 33, a media controller 34, a display controller 35, and the like, which are connected to the control bus 28.

A memory 36 for temporary storage such as SDRAM is connected to the memory controller 30. The memory controller 30 inputs the RAW data outputted from the color image sensor 26 to the memory 36. The RAW data stored in the memory 36 is read out to the AF detector 31 and the pixel signal processor 32 through a data bus 29.

The AF detector 31 calculates a focus evaluation value, which represents information related to parallax, based on the pixel signals outputted from two or more phase difference pixels in the RAW data, as is well known. The CPU 25 drives the lens driver 22 based on the focus evaluation value obtained from the AF detector 31 to move the focusing lens of the taking lens 17 to a focusing position.

The pixel signal processor 32 performs various processes such as an image signal correction process for correcting pixel signals from the phase difference pixels (or combined pixel signals in which the pixel signals from the phase difference pixels are combined), a demosaicing process, a gamma correction process, and an RGB/YCrCb conversion process (see FIG. 12) on the RAW data. After being subjected to these processes, the image data is displayed on the display section 16 through the display controller 35, for example. The compression/decompression processor 33 compresses the image data which has been processed by the pixel signal processor 32, in a given format such as JPEG.

A recording medium 37 composed of a non-volatile memory such as a flash memory is connected to the media controller 34. The media controller 34 stores various types of image data such as the RAW data and the compressed image data in the recording medium 37 in the given format. In the reproduction mode, the media controller 34 reads the image data from the recording medium 37.

Figure 4:
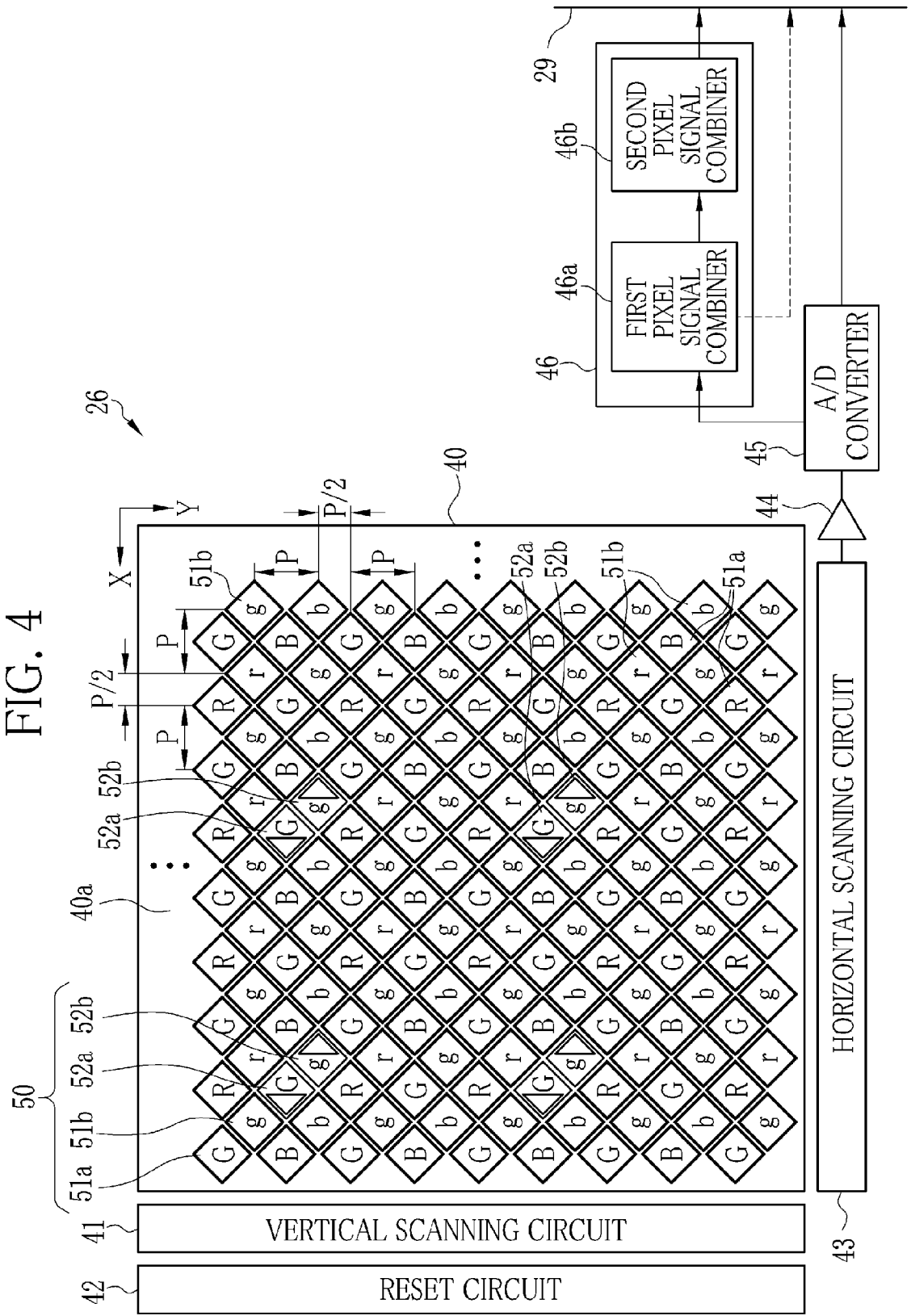
FIG. 4 is an explanatory view illustrating configuration of a color image sensor.

As illustrated in FIG. 4, the color image sensor 26 comprises an image capture section 40, a vertical scanning circuit 41 for reading, a reset circuit 42, a horizontal scanning circuit 43, an output amplifier 44, an A/D converter 45, and a pixel combining circuit (pixel combining unit) 46. The image capture section 40 comprises a plurality of pixels (which may also be called as picture elements) 50 in the light receiving area 40a. The pixels 50 are arranged two-dimensionally in X and Y directions, which are orthogonal to each other.

The pixels (which may also be called as picture elements) 50 include two types of pixels, normal pixels 51a and 51b and phase difference pixels 52a and 52b. The normal pixels 51a and the phase difference pixels 52a are disposed in odd-numbered rows and constitute a first pixel group. The normal pixels 51b and the phase difference pixels 52b are disposed in even-numbered rows and constitute a second pixel group. In each of the first pixel group and the second pixel group, the pixels 50 are arranged in a square matrix at a pitch P in the row direction (X direction) and the column direction (Y direction). The pixels 50 (the normal pixels 51b and the phase difference pixels 52b) of the second pixel group are shifted from the pixels 50 (the normal pixels 51a and the phase difference pixels 52a) of the first pixel group by a half pitch (P/2) in the X and Y directions. The pixels 50 in the first and second pixel groups constitute a so-called honeycomb array as a whole.

Each pixel 50 is provided with one of red filter, green filter, and blue filter, which differ from each other in spectral transmittance. The capital letters "R" (red), "G" (green), and "B" (blue) denote the colors of the color filters provided to the pixels 50 of the first pixel group. The small letters "r" (red), "g" (green), and "b" (blue) denote the colors of the color filters provided to the pixels 50 of the second pixel group. Each color filter transmits light in a wavelength range of the corresponding color. The color arrangement of the color filters of the first pixel group is the same as that of the second pixel group. In this embodiment, the color filters in each of the first and second pixel groups are in the Bayer arrangement. The pixel 50 (of the first pixel group) and the pixel 50 (of the second pixel group) adjacent in an oblique direction have the color filters of the same color.

The phase difference pixel 52a of the first pixel group has the G filter. Every fourth pixel in each of X and Y directions is the phase difference pixel 52a with the G filter. The phase difference pixel 52b of the second pixel group has the g filter. Every fourth pixel in each of X and Y directions is the phase difference pixel 52b with the g filter. The phase difference pixel 52a of the first pixel group is adjacent to the phase difference pixel 52b of the second pixel group and these two pixels constitute a pair.

The phase difference pixel 52a of the first pixel group is a left phase difference pixel that selectively receives light incident on the left side thereof of the isotropic incident light. The phase difference pixel 52b of the second pixel group is a right phase difference pixel that selectively receives light incident on the right side thereof. At the time of AF control, the pair of pixel signals outputted from the left and right phase difference pixels is extracted from the RAW data, and used for calculating the focus evaluation value by the AF detector 31. In order to produce an image, which is to be displayed or stored, based on the RAW data, the pixel signal processor 32 corrects the pixel signal from the phase difference pixel 52a, the pixel signal from the phase difference pixel 52b, or the pixel signal from the combined pixel signal, which is obtained by adding the pixel signal from the phase difference pixel 52a and/or the pixel signal from the phase difference pixel 52b.

The pixels other than the phase difference pixels 52a and 52b of the first and second pixel groups are the normal pixels 51a and 51b. The normal pixels 51a and 51b receive the incident light evenly or isotropically. Since every fourth pixel of the first pixel group is the phase difference pixel 52a of the first pixel group, the normal pixel 51a with the G filter, which is of the same color as the G filter of the phase difference pixel 52a, is disposed between the closest phase difference pixels 52a. In a like manner, every fourth pixel of the second pixel group is the phase difference pixel 52b of the second pixel group, so that the normal pixel 51b with the G filter, which is of the same color as the G filter of the phase difference pixel 52b, is disposed between the closest phase difference pixels 52b.

The vertical scanning circuit 41 sequentially outputs a row selection signal to each row of the pixels in the image capture section 40. The reset circuit 42 sequentially outputs a reset signal to each row of the pixels. The reset circuit 42 is capable of collectively outputting the reset signals to the entire first pixel group or the entire second pixel group independently.

The horizontal scanning circuit 43 sequentially outputs a column selection signal and sequentially transfers the pixel signal, which is outputted from each pixel 50 of the pixel row selected by the row selection signal, to the output amplifier 44. The output amplifier 44 amplifies the pixel signal and then inputs the pixel signal to the A/D converter 45. The A/D converter 45 digitally converts the pixel signal and outputs the digitally converted pixel signal. In the normal mode, the pixel signal from the A/D converter 45 is outputted as the RAW data. In the pixel combining mode and the wide dynamic range mode, the pixel signal from the A/D converter 45 is inputted to the pixel combining circuit 46.

The pixel combining circuit 46 comprises a first pixel combiner 46a and a second pixel combiner 46b. The first pixel combiner 46a performs a first pixel combining process in which the pixel signals of the obliquely adjacent pixels of the same color of the first and second pixel groups are added. After the first pixel combining process, the second pixel combiner 46b performs a second pixel combining process in which the pixel signals of the pixels of the same color which are adjacent (in close proximity) in the column direction (Y direction) are added. In the pixel combining mode for obtaining an image with high sensitivity, the combined pixel signal, in which four pixel signals in total are added by the first and second pixel combiners 46a and 46b, is outputted as the RAW data to the data bus 29. In the wide dynamic range mode, the combined pixel signal obtained through the first pixel combining process performed by the first pixel combiner 46a is outputted as the RAW data to the data bus 29.

Figure 5:
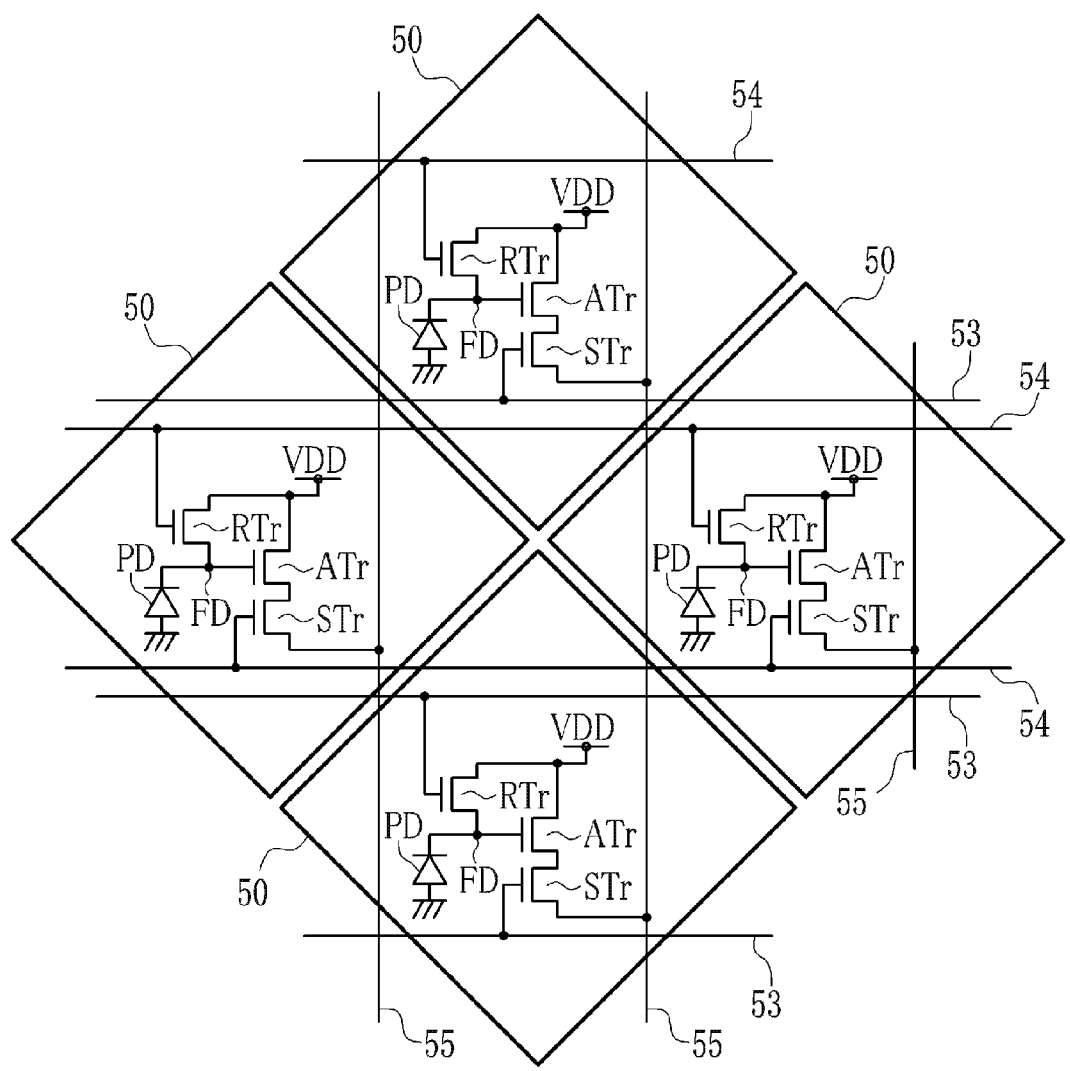
FIG. 5 is a circuit diagram illustrating electric configuration of a pixel.

As illustrated in FIG. 5, each pixel 50 comprises a photodiode (photoelectric conversion element) PD, a reset transistor RTr, an amplifying transistor ATr, and a select transistor STr. Thus, each pixel 50 has 3-transistor configuration. Each transistor is an n-type MOS transistor, for example.

Each pixel 50 is connected to two drive lines: a row selection line 53 and a reset line 54. Each of the row selection line 53 and the reset line 54 is connected to the pixels 50 of the same row. An end of the row selection line 53 is connected to the vertical scanning circuit 41. An end of the reset line 54 is connected to the reset circuit 42.

Each pixel 50 is connected to a signal line 55. The signal line 55 is connected to the pixels 50 of the same column. An end of the signal line 55 is connected to the horizontal scanning circuit 43.

The photodiode PD photoelectrically converts the received light into a charge which corresponds to the amount of the received light. The anode of the photodiode PD is connected to ground. The cathode of the photodiode PD is connected to the gate electrode of the amplifying transistor ATr. A floating diffusion FD is formed in a connect section between the cathode of the photodiode PD and the gate electrode of the amplifying transistor ATr. The floating diffusion FD stores the charge generated by the photodiode PD.

The source electrode of the reset transistor RTr is connected to the floating diffusion FD. The drain electrode of the reset transistor RTr is connected to a power supply voltage VDD. The reset transistor RTr is turned on by supplying the reset signal to the gate electrode through the reset line RST. When the reset transistor RTr is turned on, the power supply voltage VDD is applied to the floating diffusion FD, and thereby the stored charge is discharged.

The gate electrode of the amplifying transistor ATr is connected to the floating diffusion FD. The power supply voltage VDD is applied to the drain electrode of the amplifying transistor ATr. The amplifying transistor ATr outputs the pixel signal (pixel value), which corresponds to the charge stored in the floating diffusion FD, from the source electrode.

The drain electrode of the select transistor STr is connected to the source electrode of the amplifying transistor ATr. The source electrode of the select transistor STr is connected to the signal line 55. The select transistor STr is turned on by supplying the row selection signal to the gate through the row selection line 53. When the select transistor STr is turned on, the pixel signal which is outputted from the source electrode of the amplifying transistor ATr is outputted to the signal line 55.

Rolling shutter operation and global shutter operation are the exposure operations of the image capture section 40. In the rolling shutter operation, the mechanical shutter 24 is in the open state. The vertical scanning circuit 41 supplies a row selection signal to each pixel row through the row selection line 53, and the reset circuit 42 supplies a reset signal to each pixel row through the reset line 54. While the row selection signal is supplied to the pixel row, the horizontal scanning circuit 43 sequentially reads out the pixel signal outputted to each signal line 55 and the reset signal is supplied to the preceding pixel row. The reading operation and the reset operation are repeated while the pixel rows to be subjected to the reading and reset operations are shifted. Thereby, the image data of one frame or more is obtained. The rolling shutter operation is performed in the AF operation and in the movie mode.

In the global shutter operation, the mechanical shutter 24 is in the open state. The reset signals are collectively supplied to the first and second pixel groups. Thereby collective reset is performed. Then, after a predetermined time period, the mechanical shutter 24 is closed. The pixel signal of each pixel is read out in time series by supplying a row selection signal to each pixel row with the mechanical shutter 24 closed. Thus, the image data of one frame is obtained. The global shutter operation is used in the normal mode and the pixel combining mode.

In the global shutter operation in the wide dynamic range mode, the timing for supplying the reset signal to the first pixel group differs from the timing for supplying the reset signal to the second pixel group. Thereby the exposure time of the first pixel group differs from that of the second pixel group. For example, the first pixel group is set to a long exposure time and the second pixel group is set to a short exposure time. Thereby the pixel signals obtained from the first pixel group are high sensitivity signals. The pixel signals obtained from the second pixel group are low sensitivity signals. The pixel combining circuit 46 combines the high and low sensitivity signals with each other. Thus, the image data with the wide dynamic range is obtained.

Note that the pixel 50 is not limited to the 3-transistor configuration. The pixel 50 may have 4-transistor configuration, in which a transfer transistor is further provided between the photodiode PD and the floating diffusion FD.

Figure 6:
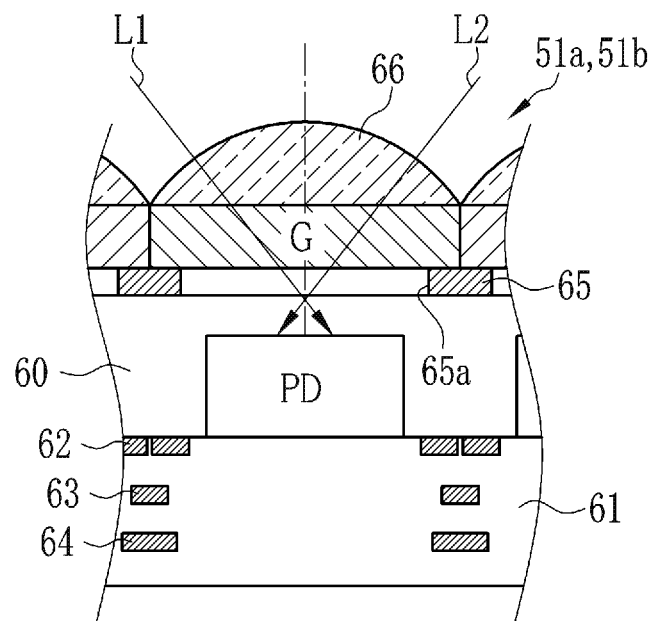
FIG. 6 is a cross-sectional view of a normal pixel.

As illustrated in FIG. 6, the color image sensor 26 is a back-side illumination type. In each of the normal pixels 51a and 51b, the photodiode PD is formed in a p-type semiconductor substrate 60. A wiring layer 61 is formed on the opposite side of the light incident side of the p-type semiconductor substrate 60. The wiring layer 61 is provided with electrodes 62, which are formed from amorphous silicon or the like, and wirings 63 and 64, which are formed from aluminum or the like. The electrodes 62 and the wirings 63 and 64 constitute the electrodes and the wirings of each of the above-described transistors.

A light shielding layer 65, which is formed from aluminum or the like, is provided on the light incident side of the p-type semiconductor substrate 60. In each of the normal pixels 51a and 51b, a normal opening 65a is disposed in the light shielding layer 65, at the position corresponding to the position of the photodiode PD. The center of the normal opening 65a is substantially coincident with the center of the photodiode PD. The entire surface of the photodiode PD on the light incident side is exposed through the normal opening 65a.

A color filter (in this example, the G filter) is provided on the light incident side of the light shielding layer 65. A microlens 66 is formed on the light incident side of the color filter. The color filter is formed from a resin material in which a dye or a pigment is dispersed. The microlens 66 is formed from silicon dioxide or a transparent resin material. The optical axis of the microlens 66 is substantially coincident with the center of the photodiode PD. The microlens 66 collects the incident light on the photodiode PD. Of the light exited from the microlens 66, only the light of the color separated by the color filter of the corresponding color passes through the normal opening 65a and then enters the photodiode PD.

Each of the normal pixels 51a and 51b receives both of incident light L1, which is incident from the left side, and incident light L2, which is incident from the right side. In other words, the normal pixels 51a and 51b receive the incident light evenly and isotropically.

Figure 7:
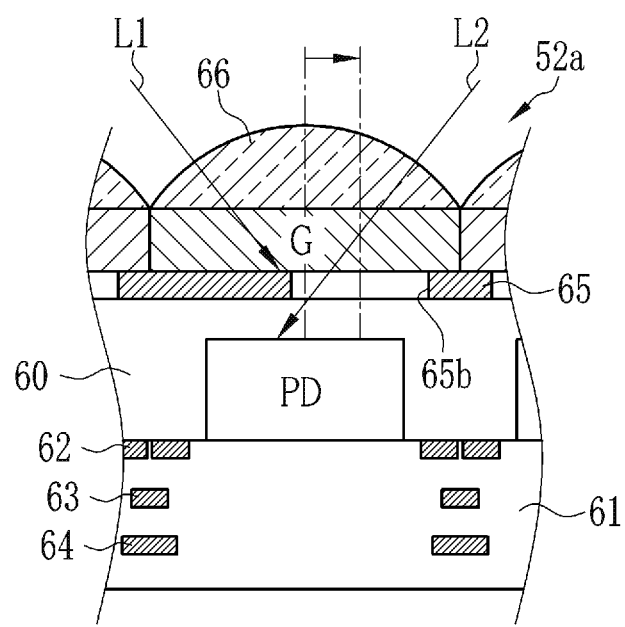
FIG. 7 is a cross-sectional view of a phase difference pixel provided in a first pixel group.

As illustrated in FIG. 7, in the phase difference pixel 52a of the first pixel group, a first off-center opening 65b is disposed in the light shielding layer 65, at the position corresponding to the position of the photodiode PD. The center of the first off-center opening 65b is shifted to the right from the center of the photodiode PD. Only a part of the surface of the photodiode PD on the light incident side is exposed through the first off-center opening 65b.

Thereby, in the phase difference pixel 52a of the first pixel group, the incident light L1, which is incident from the left side is blocked by the light shielding layer 65. The incident light L2, which is incident from the right side, passes through the first off-center opening 65b and enters the photodiode PD. Thus, the phase difference pixel 52a of the first pixel group selectively receives the incident light L2, which is incident from the right side. Other than the component described above, the components of the phase difference pixel 52a of the first pixel group are the same as or similar to those of the normal pixels 51a and 51b.

Figure 8:
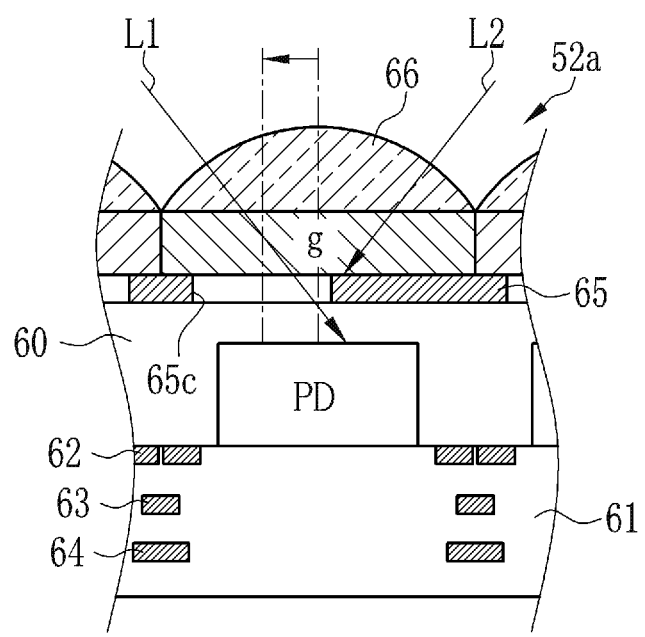
FIG. 8 is a cross-sectional view of a phase difference pixel provided in a second pixel group.

As illustrated in FIG. 8, in the phase difference pixel 52b of the second pixel group, a second off-center opening 65c is disposed in the light shielding layer 65, at the position corresponding to the position of the photodiode PD. The center of the second off-center opening 65c is shifted to the left from the center of the photodiode PD. Only a part of the surface of the photodiode PD on the light incident side is exposed through the second off-center opening 65c.

Thereby, in the phase difference pixel 52b of the second pixel group, the incident light L2, which is incident from the right side, is blocked by the light shielding layer 65. The incident light L1, which is incident from the left side, passes through the second off-center opening 65c and enters the photodiode PD. Thus, the phase difference pixel 52b of the second pixel group selectively receives the incident light L1, which is incident from the left side. Other than the component described above, the components of the phase difference pixel 52b of the second pixel group are the same as or similar to those of the normal pixels 51a and 51b.

Each of the phase difference pixels 52a and 52b of the first and second pixel groups selectively receives only the light incident from the left side or the right side, so that the amount of the light received is small and the sensitivity is low as compared with those of the normal pixel 51a or 51b. The phase difference pixels 52a and 52b are sensitive to the light incident angles as compared with the normal pixels 51a and 51b. The properties of the phase difference pixels 52a and 52b vary (for example, the sensitivities thereof may further increase or decrease) depending on the positions of the phase difference pixels 52a and 52b in the image capture section 40. For this reason, the pixel signal of the phase difference pixel 52a or 52b (or the combined pixel signal in which the pixel signal of the phase difference pixel 52a is combined with the pixel signal of the phase difference signal 52b) is a defective signal in the image data to be displayed or stored. Therefore such defective signal is distinguished from the pixel signal of the normal pixel 51a or 51b (or the combined pixel signal in which only the pixel signal of the normal pixel 51a is combined with the pixel signal of the normal pixel 51b).

Note that the phase difference pixels 52a and 52b are disposed for the phase detection AF. The defects derived from the phase difference pixels 52a and 52b are inevitable. The positions of the defects derived from the phase difference pixels 52a and 52b are predetermined depending on the arrangement of the phase difference pixels 52a and 52b. Such defects differ from failure (the so-called flaw) which occurs incidentally at random positions during manufacture of the color image sensor 26 or due to the deterioration with time. In this embodiment, the incidental failure is disregarded for the sake of simplicity. Unless otherwise specified, a "defective pixel" refers to a pixel having a pixel signal of the phase difference pixel 52a or 52b. A "defective combined pixel" refers to a combined pixel which is based on a combined pixel signal obtained by combining the pixel signal of the phase difference pixel 52a or 52b. A "normal combined pixel" refers to a combined pixel which is based on a combined pixel signal obtained by combining the pixel signals of the normal pixels 51a and 51b. Note that methods for correcting the incidentally occurring defective pixel values have been known, so that those defective pixel values may be corrected by using a proper method.

Figure 9:
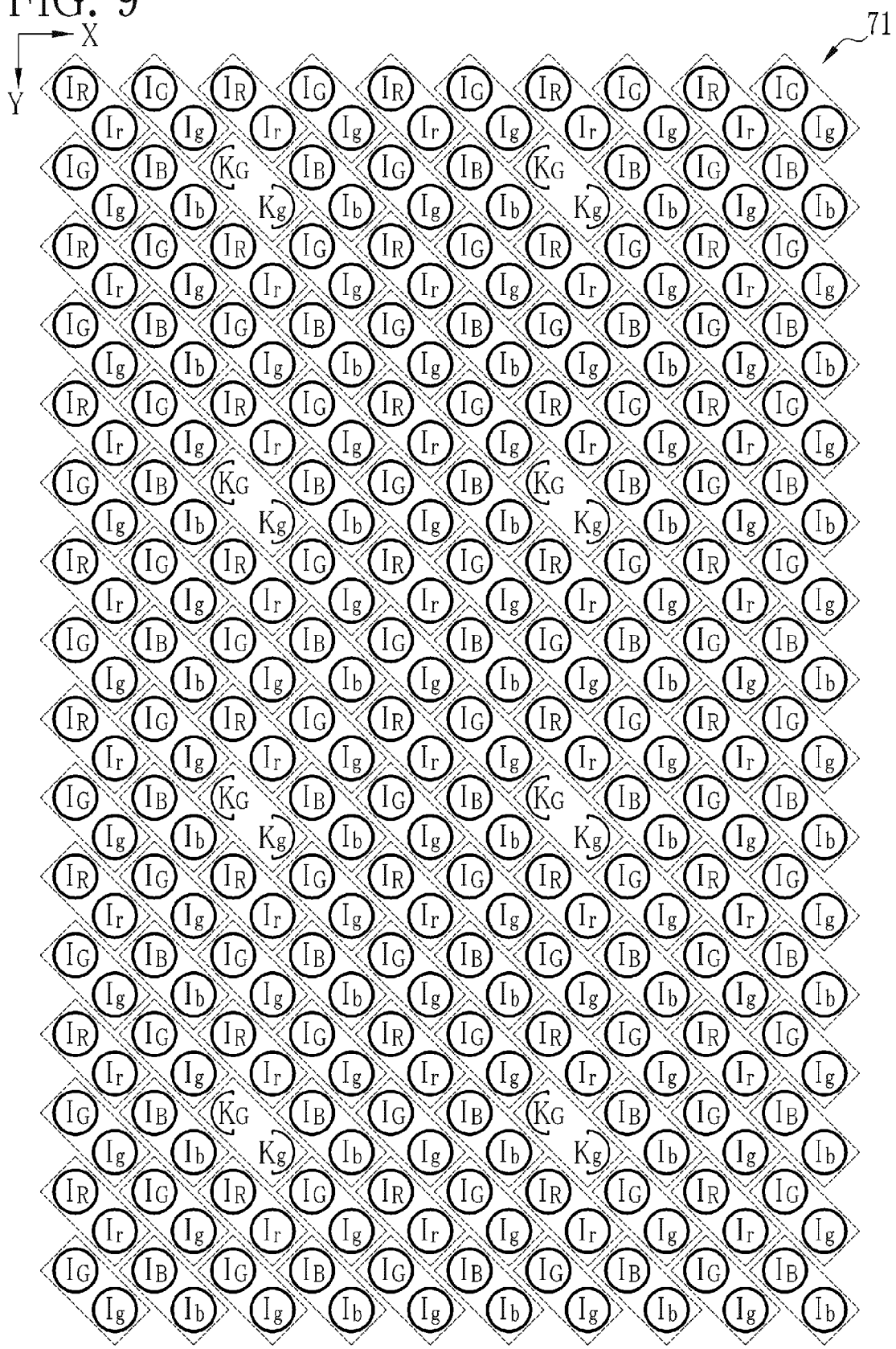
FIG. 9 is an explanatory view illustrating an arrangement of pixels in a normal image.

Next, a pixel combining process performed by the pixel combining circuit 46 is described. During the imaging performed by the color image sensor 26, the charge stored in each pixel 50 of the image capture section 40 is read out as the pixel signal. Each pixel signal is digitally converted by the A/D converter 45, and then transmitted as image data (normal image data) 71 to the pixel combining circuit 46. As illustrated in FIG. 9, the image data 71 refers to the pixel signals of one frame. The pixels of the image data 71 corresponds to the pixels 50, respectively. In the normal mode, the image data 71 is outputted as the RAW data. Characters (letters) in each pixel represent the pixel signal. For example, "$I_R$", "$I_G$", and "$I_B$" represent the pixel signals from the normal pixels 51a of the first pixel group. "$I_r$", "$I_g$", and "$I_b$" represent the pixel signals from the normal pixels 51b of the second pixel group. "$K_G$" and "$K_g$" represent the pixel signals from the phase difference pixels 52a and 52b of the first and second pixel groups, respectively. Each subscript of the pixel signals $I_R$, $I_G$, $I_B$, $I_r$, $I_g$, $I_b$, $K_G$, and $K_g$ represents the color of the corresponding color filter. The pixel which is based on the normal pixel 51a or 51b is depicted with a circle. A pixel based on the phase difference pixel 52a or 52b is depicted with a semicircle.

In the pixel combining mode and the wide dynamic range mode, the first pixel combiner 46a performs a first pixel combining process to generate first composite image data 72 (see FIG. 10) from the normal image data 71. In the first pixel combining process, as illustrated with dotted boxes in FIG. 9, the pixel signals which are obtained from the obliquely adjacent pixels of the same color of the first and second pixel groups are added or averaged. To be more specific, the pixel signal $I_R$ of the red normal pixel 51a of the first pixel group is combined with the pixel signal $I_r$ of the red normal pixel 51b, which is adjacent to the red normal pixel 51a, of the second pixel group. In a like manner, the pixel signal $I_G$ of the green normal pixel 51a of the first pixel group is combined with the pixel signal $I_g$ of the green normal pixel 51b, which is adjacent to the green normal pixel 51a, of the second pixel group. The pixel signal $I_B$ of the blue normal pixel 51a of the first pixel group is combined with the pixel signal $I_b$ of the blue normal pixel 51b, which is adjacent to the blue normal pixel 51a, of the second pixel group. With regard to the phase difference pixels 52a and 52b, the pixel signal $K_G$ of the phase difference pixel 52a of the first pixel group is combined with the pixel signal $K_g$ of the phase difference pixel 52b of the second pixel group, in a manner similar to the normal pixels 51a and 51b.

Figure 10:
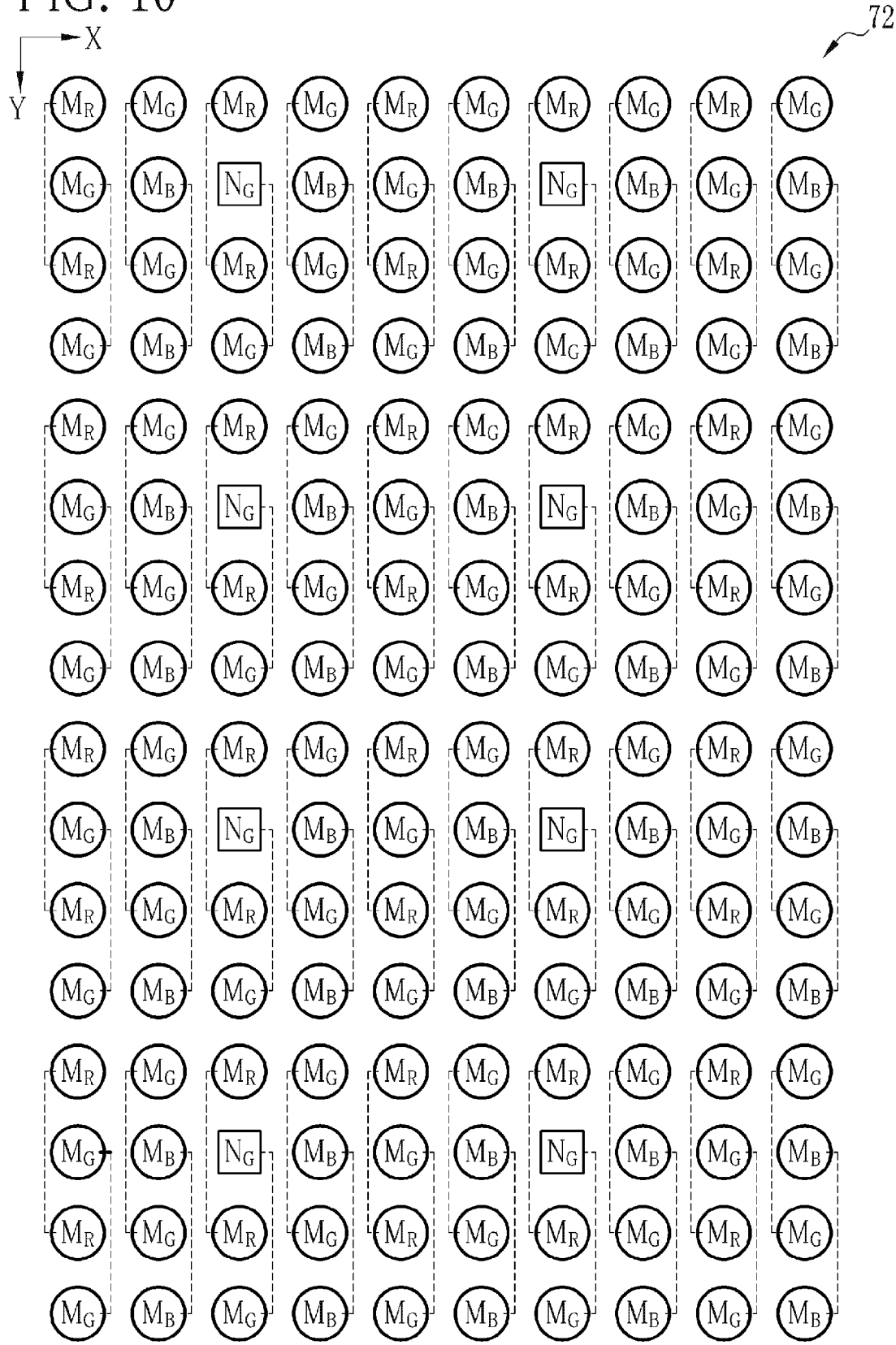
FIG. 10 is an explanatory view illustrating an arrangement of pixels in a first composite image.

FIG. 10 illustrates the first composite image data 72 generated by the first pixel combining process. In the first composite image data 72, each of pixel signals $M_R$, $M_G$, and $M_B$ is generated by combining the pixel signals of the normal pixels 51a and 51b. The pixel signal $N_G$ is generated by combining the pixel signals $K_G$ and $K_g$ of the phase difference pixels 52a and 52b. Here, the pixel signal $N_G$ is depicted in a rectangular shape to show that the pixel signal $N_G$ is obtained by combining the pixel signals of the phase difference pixels 52a and 52b. Note that a subscript represents the color of the color filter.

As described above, in the first pixel combining process, the pixel signals of two pixels are combined with each other to generate a first combined pixel. The pixel signals of the normal pixels 51a and 51b are combined with the pixel signals of the normal pixels 51b and 51a, respectively. The pixel signals of the phase difference pixels 52a and 52b are combined with the pixel signals of the phase difference pixels 52b and 52a, respectively. Therefore the first combining process is a combining process for combining the pixel signals of the pixels of the same type (hereinafter referred to as the same pixel type combining process). Thereby a first combined pixel is generated for each color.

The first combined pixel of the first composite image data 72 is based on the first combined pixel signal that is obtained by combining the pixel signals of the two obliquely adjacent pixels, so that the pixels are arranged in a square matrix as illustrated in FIG. 10. Note that the pixels in the normal image data 71 are arranged in a honeycomb array, which corresponds to the pixel arrangement in the color image sensor 26.

In the pixel combining mode, the second pixel combiner 46b performs the second pixel combining process to generate second composite image data 73 (see FIG. 11) from the first composite image data 72. In the second pixel combining process, the pixel signals of first combined pixels of the same color, which are closest in the Y direction (column direction) of the first composite image data 72 are added or averaged to generate a second combined pixel that is based on the added pixel signals or the average of the pixel signals. In other words, in the first composite image data 72, the color of a given first combined pixel which corresponds to a first combined pixel signal differs from the color of another first combined pixel, which corresponds to another first combined pixel signal, adjacent to the given first combined pixel in the Y direction (above or below the given first combined pixel). Therefore the first combined pixel of a different color is skipped, and the pixel signals of the first combined pixels of the same color and which are closest in the Y direction are combined as illustrated in dotted lines in FIG. 10 to generate the second combined pixel.

To be more specific, in a column in which the pixel signal $N_G$ derived from the phase difference pixels is absent, the red pixel signal $M_R$ derived from the normal pixel is combined with another red pixel signal $M_R$ which is derived from another normal pixel (the same pixel type combining process). This applies the same to the green and blue pixel signals $M_G$ and $M_B$. In the column in which the pixel signal $N_G$ derived from the phase difference pixels is present, the pixel signals are combined with each other in a like manner. In the column in which the pixel signal $N_G$ derived from the phase difference pixels is present, the red pixel signal $M_R$ is combined with the pixel signal $M_R$. However, the pixel signal $N_G$ is combined with the pixel signal $M_G$. The pixel combining process for combining the red pixel signals $M_R$ with each other is the same pixel type combining process. The pixel combining process for combining the pixel signal $N_G$ with the pixel signal $M_G$ is the different pixel type combining process because it involves each pixel signal of the normal pixels 51a and 51b and the phase difference pixels 52a and 52b.

Figure 11:
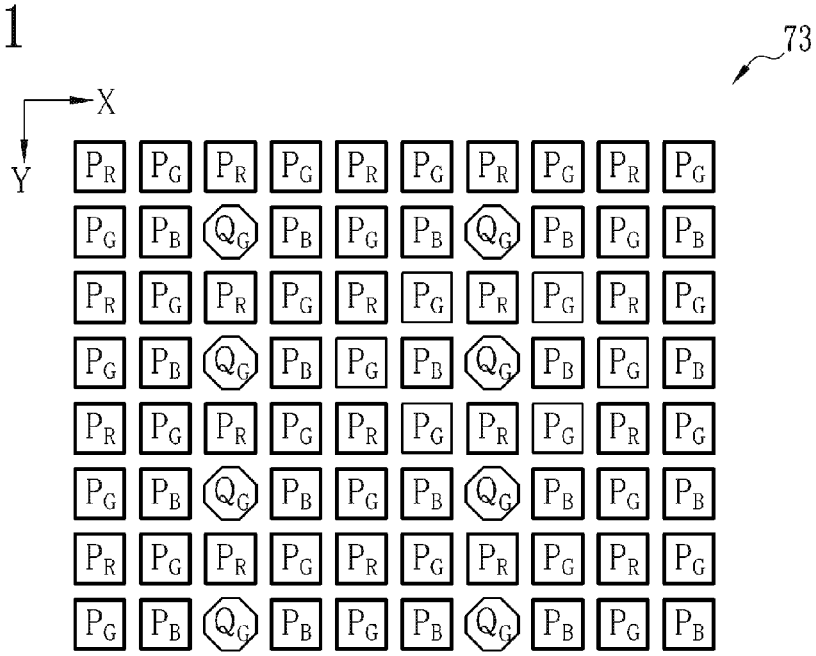
FIG. 11 is an explanatory view illustrating an arrangement of pixels in a second composite image.

FIG. 11 illustrates an arrangement of the pixels in the second composite image data 73. Each of the pixel signals $P_R$, $P_G$, and $P_B$ of the second combined pixels is generated by the same pixel type combining process in which the pixel signals of only the normal pixels 51a and 51b are combined with each other. The pixel signal $Q_G$ is generated by the different pixel type combining process in which the pixel signals of the normal pixels 51a and 51b are combined with the phase difference pixels 52a and 52b. The second combined pixel in which the pixel signals of the phase difference pixels 52a and 52b are combined is depicted in an octagonal shape.

Figure 12:
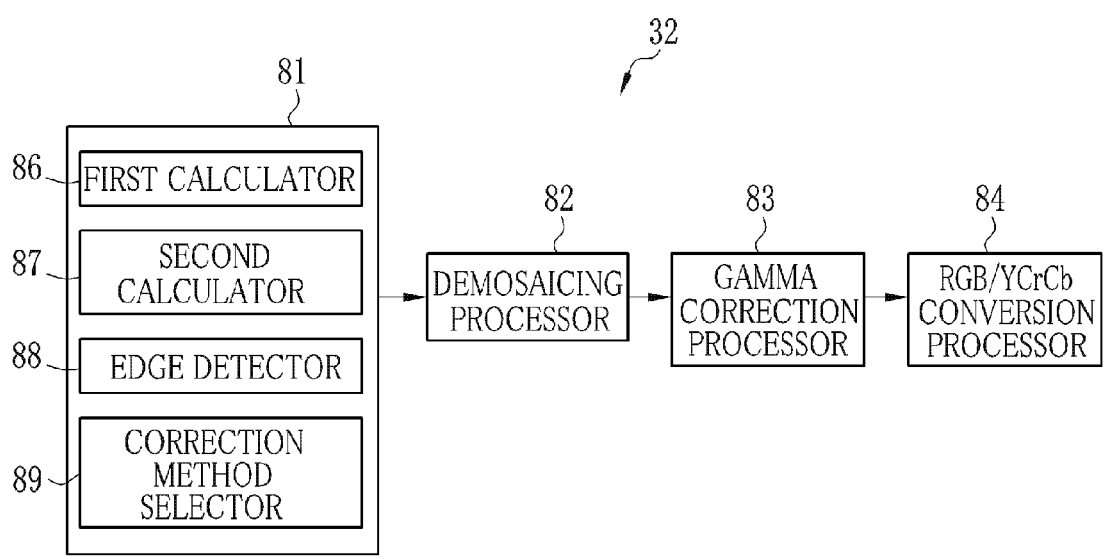
FIG. 12 is a block diagram illustrating configuration of a pixel signal correction processor.

As illustrated in FIG. 12, the pixel signal processor 32 comprises a pixel signal correction processor (corrector) 81, a demosaicing processor 82, a gamma correction processor 83, an RGB/YCrCb conversion processor 84, and the like.

The demosaicing processor 82 performs an interpolation process (demosaicing process) on the RAW data with the pixel signals of the phase difference pixels 52a and 52b and the pixel signal of a defective combined pixel 91 (see FIG. 14) corrected by the pixel signal correction processor 81 so that one pixel has the pixel signals of three colors. Through the demosaicing process, the RAW data in which one pixel has the pixel signal of one color corresponding to the color of the color filter is converted into the image data in which each pixel has red, green, and blue pixel signals. Note that in the case where the demosaicing processor 82 performs the demosaicing process on the normal image data 71, the demosaicing processor 82 also performs data interpolation to change the arrangement of the pixels from the honeycomb array to a square matrix.

The gamma correction processor 83 performs a gamma correction process based on a given gamma table. After the gamma correction process, the RGB/YCrCb conversion processor 84 performs YCbCr conversion on the composite image data and the normal image data.

The pixel signal correction processor 81 comprises a first calculator 86, a second calculator 87, an edge detector 88, and a correction method selector 89. The image sensor 26 outputs the RAW data in accordance with the imaging mode. As described above, in the normal mode, the RAW data is the normal image data 71. In the wide dynamic range mode, the RAW data is the first composite image data 72. In the pixel combining mode, the RAW data is the second composite image data 73. The pixel signal correction processor 81 corrects the pixel signals $K_G$ and $K_g$ of the defective pixels that correspond to the phase difference pixels 52a and 52b and/or the pixel signals $N_G$ and $Q_G$ of the defective combined pixels in the RAW data of each type.

The first calculator 86 corrects the pixel signals $K_G$ and $K_g$ of the defective pixels and the pixel signal $N_G$ and $Q_G$ of the defective combined pixels through gain correction to generate the pixel signals with the corrected gains. For example, in the case where the pixel signal $Q_G$ of the defective combined pixel of the second composite image data 73 is to be corrected, the pixel signal of the defective combined pixel is multiplied by a gain, which is based on the ratio between the pixel signal $P_G$ of the normal combined pixel and the pixel signal $Q_G$ of the defective combined pixel. Thereby the pixel signal with the corrected gain is generated.

Figure 13:
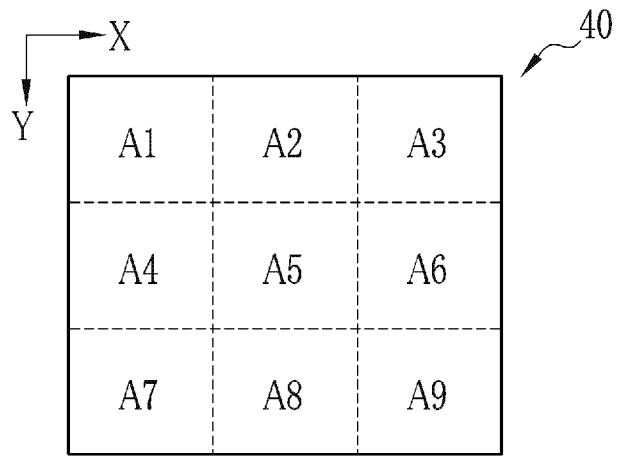
FIG. 13 is an explanatory view illustrating a region for calculating a gain.

For example, as illustrated in FIG. 13, the image capture section 40 is divided into nine regions (A1 to A9), and a gain to be multiplied is calculated for each region. For example, in the case where the pixel signal $Q_G$ of the defective combined pixel in the second composite image data 73 is to be corrected, the first calculator 86 calculates an average value (hereinafter referred to as the first average value) of the pixel signals $P_G$ of the normal combined pixels and an average value (hereinafter referred to as the second average value) of the pixel signals $Q_G$ of the defective combined pixels for each of the regions A1 to A9, and uses a ratio between the first average value and the second average value as a gain γ (γ=the first average value/the second average value) for each of the regions A1 to A9. For this reason, the gain γ used by the first calculator 86 varies depending on the regions A1 to A9 and the subject.

Note that the gain correction for the pixel signal $N_G$ of the defective pixel in the first composite image data 72 and the gain correction for the pixel signals $K_G$ and $K_g$ of the defective pixels (pixels which correspond to the phase difference pixels 52a and 52b) in the normal image data 71 are performed in the same manner as the gain correction for the second composite image data 73.

Figure 14:
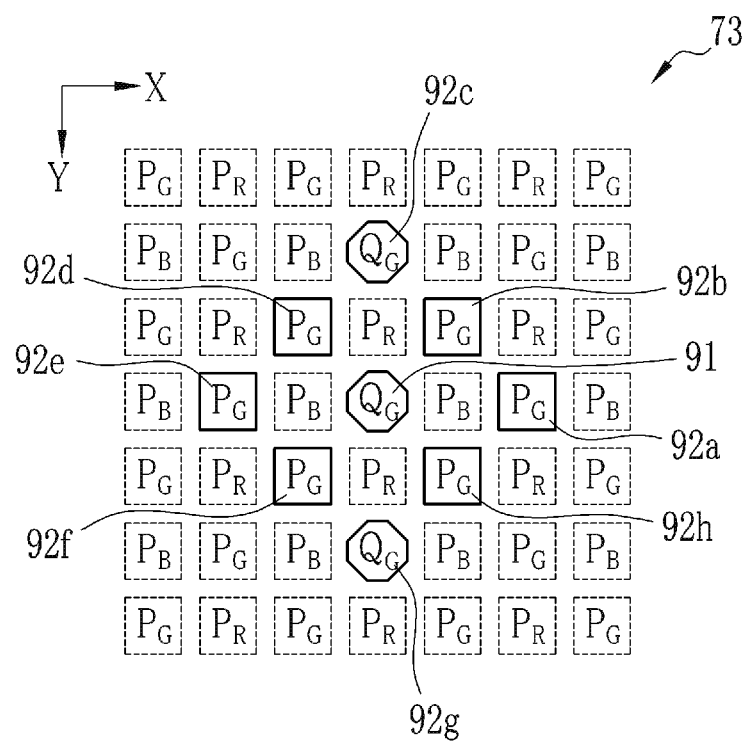
FIG. 14 is an explanatory view illustrating pixels used for correction through interpolation and edge detection.

The second calculator 87 corrects the pixel signals $K_G$ and $K_g$ of the defective pixels and the pixel signals $N_G$ and $Q_G$ of the defective combined pixels through interpolation. Thereby the interpolation-corrected pixel signal which has been subjected to the interpolation correction is generated. For example, as illustrated in FIG. 14, in the case where the pixel signal $Q_G$ of the defective combined pixel 91 of the second composite image data 73 is corrected through the interpolation, the second calculator 87 uses the green pixels which are disposed around the defective combined pixel 91 to generate the interpolation-corrected (or interpolated) pixel signal, which has been corrected through the interpolation correction. The pixels disposed around the defective combined pixel 91 are, for example, the normal combined pixels of the same color disposed above and below (in the Y direction or the column direction), left and right (in the X direction or the row direction), and in oblique directions (each direction where Y=±X), adjacent or closest to the defective combined pixel 91.

To be more specific, each of the pixel signals $P_G$ of normal combined pixel 92a and 92e, which are closest to the defective combined pixel 91 in the left-right direction, the pixel signals $P_G$ of normal combined pixels 92b and 92f adjacent in a right oblique direction with respect to the defective combined pixel 91, and the pixel signals $P_G$ of normal combined pixels 92d and 92h adjacent in a left oblique direction with respect to the defective combined pixel 91 is used. In this embodiment, in the second composite image data 73, the pixels closest to the defective combined pixel 91 in the up-down direction are defective combined pixels 92c and 92g. The result of the correction cannot be obtained properly in the case where the pixel signals of the defective combined pixels are used for correcting the pixel signals of the defective combined pixel 91. Therefore each of such pixel signals $Q_G$ is not used.

A method for generating the interpolation-corrected pixel signal by the second calculator 87 with the use of the normal combined pixel differs depending on the result of the edge detection performed by the edge detector 88. In the case where the edge detector 88 detects an edge (of a subject) which is vertical (including substantially vertical) to a combining direction (Y direction, see FIG. 10) of the second pixel combining process and located at round the defective combined pixel 91 to be corrected, the second calculator 87 uses the average value of the pixel signals of the normal combined pixels 92a and 92e, which are closest to the defective combined pixel 91 to be corrected in the left-right direction along the direction of the detected edge, as the interpolation-corrected pixel signal. In the case where the edge of the subject which is vertical to the combining direction of the second pixel combining process is not detected at around the defective combined pixel 91, the average value of the pixel signals $P_G$ of the surrounding normal combined pixels 92a, 92d to 92f, and 92h is used as the interpolation-corrected pixel signal.

The pixel signal $N_G$ of the defective combined pixel in the first composite image data 72 and the pixel signal $K_G$ of the defective pixel in the normal image data 71 are detected in a like manner. In this embodiment, however, the edge detector 88 does not detect the edge in the case of the first composite image data 72 and the normal image data 71. The second calculator 87 uses the average value of the pixel signals of the green normal combined pixels or of the pixels which correspond to the normal pixels 51a and 51b, which are adjacent in up-down, left-right, or oblique directions to the defective combined pixel having the pixel signal $N_G$ or the pixel signals $K_G$, as the interpolation-corrected pixel signal. In the case of the first composite image data 72 or the normal image data 71, the green pixels which are closest to the pixel which corresponds to the defective combined pixel or the defective pixel in the up-down direction are the normal pixels which are generated from the pixel signals of the normal pixels 51a and 51b. Therefore these pixel signals of the normal pixels are used for calculating the interpolation-corrected pixel signal.

The edge detector 88 is activated in the pixel combining mode, and detects whether there is an edge (of the subject), which is substantially vertical to the combining direction of the second pixel combining process, at or around the defective combined pixel 91 to be corrected. In order to detect the edge, the pixel signals $P_G$ and $Q_G$ of the nine green pixels (the normal combined pixel and the defective combined pixels 92a to 92h) disposed around the defective combined pixel 91 are used (see FIG. 14).

In order to detect the edge, first, the edge detector 88 calculates differences $\delta_{Y1}$ to $\delta_{Y3}$ between the pixel signals $P_G$ and/or $Q_G$ of the normal and defective combined pixels (out of 92a to 92h) in the Y direction parallel to the combining direction in the second pixel combining process, and then calculates a total sum (hereinafter referred to as the first edge amount) $\Delta_Y$ thereof. In the case where each pixel signal of the normal and defective combined pixels 92a to 92h is denoted by Pa, Pb, Qc, Pd to Pf, Qg, and Ph for the sake of distinction, the following is satisfied: $\delta_{Y1}=|Qc-Qg|$, $\delta_{Y2}=|Pb-Ph|$, $\delta_{Y3}=|Pd-Pf|$, $\Delta_Y=\delta_{Y1}+\delta_{Y2}+\delta_{Y3}$.

In a like manner, differences $\delta_{X1}$ to $\delta_{X3}$ between the pixel signals $P_G$ and/or $Q_G$ of the normal and defective combined pixels (out of 92a to 92h) are calculated in the X direction vertical to the combining direction in the second pixel combining process, and then a total sum (hereinafter referred to as the second edge amount) $\Delta_X$ thereof is calculated. The following is satisfied: $\delta_{X1}=|Pa-Pe|$, $\delta_{X2}=|Pb-Pd|$, $\delta_{X3}=|Ph-Pf|$, and $\Delta_X=\delta_{X1}+\delta_{X2}+\delta_{X3}$.

Furthermore, the edge detector 88 calculates a difference $D=\Delta_Y-\Delta_X$ between the first and second edge amounts $\Delta_Y$ and $\Delta_X$, and compares the difference with a given threshold value (in this embodiment, "0"). As is obvious from the above-described calculations, the first and second edge amounts $\Delta_Y$ and $\Delta_X$ represent the intensities (magnitude) of the changes in the subject in the first and second directions, respectively. The difference D represents which of the changes in the first and second directions in the subject is greater than the other.

For example, in the case where the subject is substantially uniform and has little change at around the defective combined pixel 91 to be corrected, each of the first and second edge amounts $\Delta_Y$ and $\Delta_X$ is substantially "0". Naturally the difference D is also substantially "0". In the case where the subject has horizontal stripes, so that a change in the Y direction is large and an edge is present in the X direction, the amount of the first edge amount $\Delta_Y$ is large and the second edge amount $\Delta_X$ is substantially "0". Therefore in the case where approximately D>0 (in particular D>>0), the edge (of the subject) extending in the X direction is detected at or around the defective combined pixel 91 to be detected.

In the case where the subject has vertical stripes and a change is significant in the X direction and an edge extending in the Y direction is present, the first edge amount $\Delta_Y$ is substantially "0" and the second edge amount $\Delta_X$ is large. In the case of approximately D<0 (in particular D<<0), an edge (of the subject) extending in the Y direction is detected at or around the defective combined pixel 91 is to be corrected. The edge detector 88 detects the presence or absence and the direction of the edge based on the difference D between the first and second edge amounts $\Delta_Y$ and $\Delta_X$. Thus, the comparison between a given threshold value and the difference D between the first and second edge amounts $\Delta_Y$ and $\Delta_X$ represents the detection of the direction (first direction) in which the difference D between the pixel signals is at the maximum and the detection of the edge vertical to the first direction. Note that in this embodiment, the threshold value is "0", but it may have an arbitrary value.

The edge detector 88 inputs the result of the comparison between the given threshold value and the difference D, between the first and second edge amounts $\Delta_Y$ and $\Delta_X$, to the correction method selector 89. Based on the result of the comparison, the correction method selector 89 selects one of the gain correction and the interpolation correction. In the case where the gain correction is selected, the gain-corrected pixel signal, which is generated by the first calculator 86, replaces the pixel signal $K_G$ or $K_g$ of the defective pixel or the pixel signal $N_G$ or $Q_G$ of the defective combined pixel. In the case where the interpolation correction is selected, the interpolation-corrected pixel signal, which is generated by the second calculator 87, replaces the pixel signal $K_G$ or $K_g$ of the defective pixel or the pixel signal $N_G$ or $Q_G$ of the defective combined pixel.

In order to select the method for correcting the pixel signal $Q_G$ of the defective combined pixel 91 in the second composite image data 73, for example, the correction method selector 89 selects the method for correcting the pixel signal of the defective combined pixel 91, based on the result of the comparison between the given threshold value and the difference D, between the first and second edge amounts $\Delta_Y$ and $\Delta_X$, inputted from the edge detector 88. To be more specific, the correction method selector 89 always selects the interpolation-corrected pixel signal at least in the case of D>0. The interpolation-corrected pixel signal selected in this example is the average value of the pixel signals Pa and Pe of the normal combined pixels 92a and 92e, which are closest in the left-right direction to the defective combined pixel 91 to be corrected.

In the case where the correction method selector 89 selects the method for correcting the defective combined pixel (the pixel signal $N_G$) of the first composite image data 72 and the method for correcting the pixel signal of the defective pixel of the normal image data 71, the correction method selector 89 detects, for example, the fineness and the contrast of the image of the subject in proximity of the defective combined pixel and the defective pixel (the pixels which correspond to the phase difference pixels 52a and 52b) to be corrected, and selects one of the gain-corrected pixel signal and the interpolation-corrected pixel signal so as to make the trace of the correction less conspicuous. Note that the interpolation-corrected pixel signal in this example is calculated using the pixel signals of all of the normal pixels or the normal combined pixels adjacent (or closest in each direction) in the up-down, the left-right, and the oblique directions to the defective pixel or the defective combined pixel.

Figure 15:
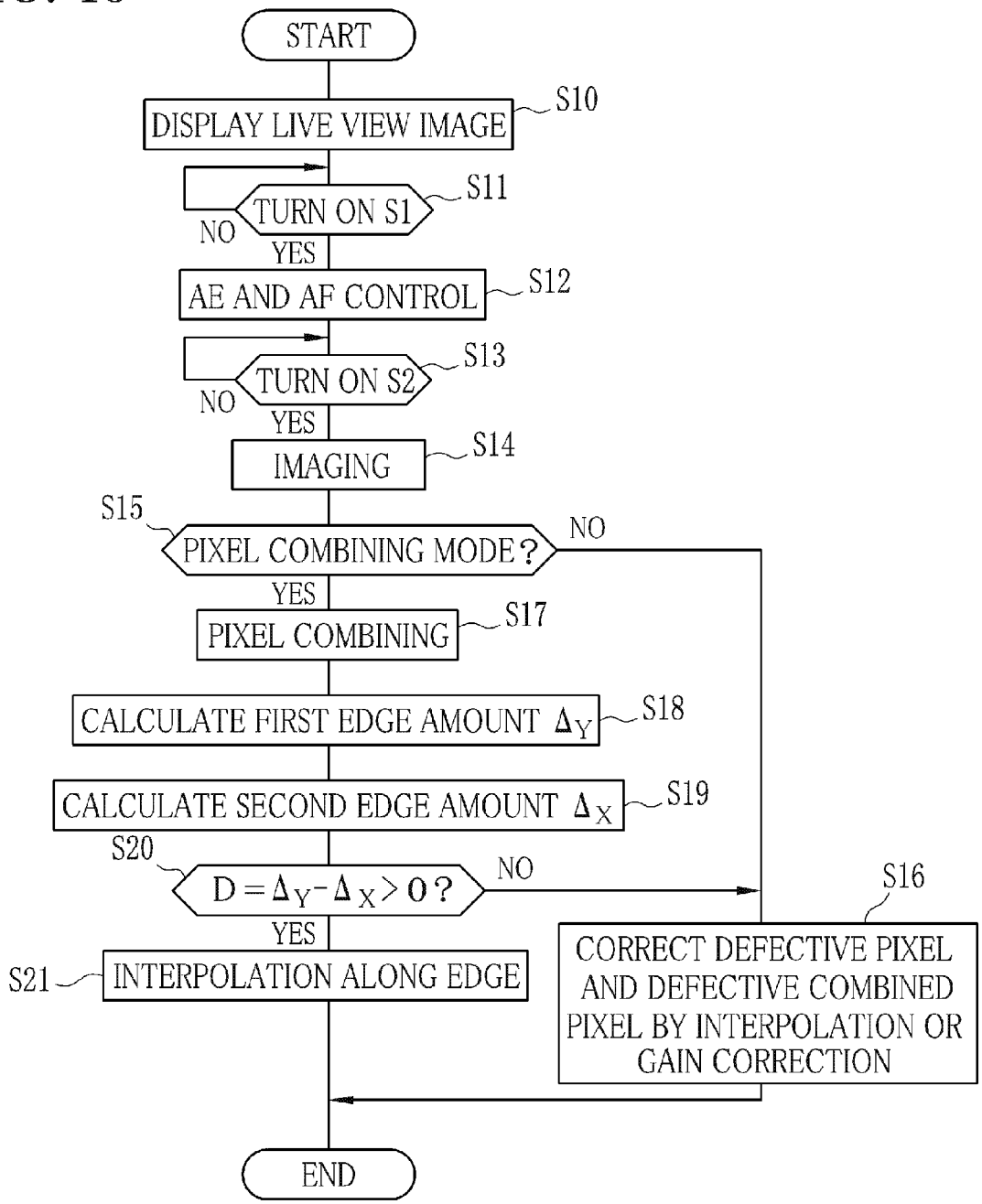
FIG. 15 is a flowchart illustrating steps for correcting a pixel signal of a phase detection pixel or a defective combined pixel.

Hereinafter, referring to FIG. 15, an operation of the digital camera 11 is described. First, the power of the digital camera 11 is turned on to be ready for imaging. In response to this, the color image sensor 26 sequentially outputs the normal image data 71, being the RAW data. The normal image data 71 is subjected to various processes such as the correction process of the pixel signals $K_G$ and $K_g$ of the phase difference pixels 52a and 52b and the demosaicing process, and then displayed as a live view image on the display section 16 (S10) in a manner similar to the normal mode.

Upon pressing of the release button 19 and turning on of the S1 switch (S11), the AE and AF control is performed (S12). The AE controller (not shown) takes out the pixel signals of the normal pixels 51a and 51b from the normal image data and calculates the exposure value. The aperture stop value and the shutter speed are calculated based on the exposure value. In order to perform the AF control, the AF detector 31 obtains the pixel signals $K_G$ and $K_g$ of the phase difference pixels 52a and 52b from the normal image data 71 and calculates the focus evaluation value based on the obtained pixel signals. Based on the focus evaluation value, the focusing lens is moved to the focusing position.

Upon further pressing of the release button 19 and turning on of the S2 switch (S13), the imaging is performed with the previously determined exposure conditions (S14). Upon imaging, the color image sensor 26 outputs the RAW data which corresponds to the imaging mode chosen previously. First, the pixel signal correction processor 81 performs the correction process on the pixel signals of the phase difference pixels 52a and 52b or the pixel signal of the defective combined pixel contained in the RAW data outputted from the color image sensor 26. Thereafter, the RAW data is sequentially subjected to the demosaicing process, the gamma correction process, the RGB/YCrCb conversion process, and the like, and then stored in the memory 36.

For example, in the case where the normal mode is chosen (NO in S15), the normal image data 71 (see FIG. 9) is outputted as the RAW data. The normal image data 71 is generated by reading a pixel signal from each pixel in the color image sensor 26. Since the pixel combining process is not performed, each pixel of the normal image data 71 corresponds to each pixel of the image sensor 26. In the color image sensor 26, all of the green pixels, of the first pixel group, which are closest to the phase difference pixel 52a of the first pixel group in the up-down, the left-right, and the oblique directions are normal pixels 51a, and there are eight of them at the maximum. All of the green pixels, of the second pixel group, which are closest to the phase difference pixel 52b of the second pixel group in the up-down, the left-right, and the oblique directions are also the normal pixels 51b, and there are eight of them at the maximum. The pixel signal of the defective pixel which corresponds to the phase difference pixel 52a or 52b of the normal image data 71 is corrected properly by either of the gain correction and the interpolation correction, with the use of the pixel signals of the eight closest normal pixels 51a or 51b at the maximum. The correction method selector 89 may select one of the gain correction and the interpolation correction with less trace of the correction. Thereby the pixel signal of the defective pixel which is based on the phase difference pixel 52a or 52b is corrected accurately (S16).

In the case where the wide dynamic range mode is chosen (NO in S15), the first pixel combiner 46a combines the pixel signals of two obliquely adjacent pixels of the first and second pixel groups in the normal image data 71. Thereby the first composite image data 72 is obtained. The color image sensor 26 outputs the first composite image data 72 as the RAW data. In the first composite image data 72, each of the first combined pixel signals of the pixels closest to the defective combined pixel (the pixel signal $N_G$), in which the pixel signals of the phase difference pixels 52a and 52b are combined with each other, in the up-down, the left-right, and the oblique directions is the pixel signal $M_G$, and the defective combined pixel (the pixel signal $N_G$) does not exist. For this reason, either of the gain correction and the interpolation correction is performed properly. The correction method selector 89 selects one of the gain correction and the interpolation correction which allows less trace of correction and corrects the pixel signal of the defective combined pixel through the selected correction method (S16).

In the case where the pixel combining mode is chosen (YES in S15), the color image sensor 26 sequentially performs the first pixel combining process with the first pixel combiner 46a and the second pixel combining process with the second pixel combiner 46b, and thereby outputs the second composite image data 73 as the RAW data (S17). The pixel signal $Q_G$ of the defective combined pixel contained in the second composite image data 73 is the pixel in which the pixel signals $I_G$ and $I_g$ from the normal pixels 51a and 51b are combined with the pixel signals $K_G$ and $K_g$ from the phase difference pixels 52a and 52b through the first and second pixel combining processes. Therefore, in the case where the edge of the subject is present in the close proximity, the correction may not be performed properly through the gain correction or the interpolation correction in a manner similar to that applied to the normal image data 71 or the first composite image data 72.

In the case of imaging performed in the pixel combining mode, the edge detector 88 detects the presence or absence and the direction of the edge of the subject. The correction is performed in a manner different from those of the normal image data 71 and the first composite image data 72, depending on the direction of the detected edge.

To be more specific, the edge detector 88 calculates the first edge amount $\Delta_Y$ which represents the presence or absence of the edge of the subject in the X direction (S18). The edge detector 88 calculates the second edge amount $\Delta_X$ which represents the presence or absence of the edge in the Y direction (S19). The difference D between the first edge amount $\Delta_Y$ and the second edge amount $\Delta_X$ is calculated. The difference D is compared with the given threshold value ("0") to detect the direction in which the edge amount is at the maximum. Thus, the edge is detected (S20). Note that S18 to S20 correspond to the edge detection step.

In the case where the difference D between the first and second edge amounts $\Delta_Y$ and $\Delta_X$ is greater than the given threshold value (0) (YES in S20), the edge (of the subject) extending in the first direction is present in the proximity of the defective combined pixel to be corrected. In the second composite image data 73, the pixel signal $Q_G$ of the defective combined pixel is generated by the second pixel combining process. In the second pixel combining process, the pixel signal $N_G$ of the defective combined pixel is combined with the pixel signal $M_G$ of the normal combined pixel, and the defective combined pixel and the normal combined pixel are close to each other in the Y direction. In the case where the edge of the subject is present in the X direction, it is regarded that the pixel signals are combined through the second pixel combining process which is performed across the edge.

The value of the pixel signal $Q_G$ of the second combined pixel varies depending on whether the pixel combining process is performed across the edge of the subject or not, even if the pixel signal $Q_G$ is obtained by combining the pixel signals $N_G$ and $M_G$ of the first combined pixel signals which are close to each other. In other words, in the case where the pixel signals of the pixels located across the edge of the subject are combined with each other, the pixel signal $Q_G$ takes a special value.

The gain γ used for the normal gain correction is calculated based on the average sensitivity ratio between the pixel signal $Q_G$ and the pixel signal $P_G$ in each of the relatively wide regions A1 to A9 illustrated in FIG. 13. Therefore it is suitable for the gain correction of the pixel signal $Q_G$ generated by the pixel combining process which is not performed across the edge. However, it is not suitable for the correction of the special pixel signal $Q_G$ that is generated by the pixel combining process performed across the edge.

In the case where the pixel signal $Q_G$ is corrected by the normal interpolation and the number of the pixels (pixel signal $P_G$) is substantially greater on one of the sides than on the other side with respect to the edge of the subject, the value of the interpolation-corrected pixel signal becomes close to the value of the pixel signal $P_G$ of the pixel located on the one side in which the number of the pixels (the pixel signals $P_G$) is greater than that of the other side. On the other hand, in the case where the number of the pixels (the pixel signal $P_G$) used for the interpolation is greater on the other side than that on the one side, the value of the interpolation-corrected pixel signal becomes closer to the value of the pixel signal $P_G$ of the pixel located on the other side. For this reason, it is difficult to obtain an accurate and stable result through the normal interpolation correction.

In the case where the difference between the first and second edge amounts $\Delta_Y$ and $\Delta_X$ is greater than the given threshold value (0), in order to generate an interpolation-corrected pixel signal for correcting the pixel signal $Q_G$ of the defective combined pixel in which the second pixel combining process has possibly been performed across the edge, the second calculator 87 generates the interpolation-corrected pixel signal for the defective combined pixel with the use of only the pixel signals $P_G$ located in a direction (X direction) along the edge. Then the correction method selector 89 replaces the pixel signal $Q_G$ of the defective combined pixel with the interpolation-corrected pixel signal that is generated using only the pixel signals $P_G$ of the pixels located along the edge (S20). In other words, the pixel signal $Q_G$ of the defective combined pixel in which the pixel combining process has possibly been performed across the edge of the subject is corrected through the interpolation using only the pixel signals $P_G$ of the normal combined pixels in which the pixel combining process has possibly been performed across the edge of the subject and which are located close to the defective combined pixel. Note that the correction step refers to generating the interpolation-corrected pixel signal and replacing the pixel signal $Q_G$.

The pixel signal $Q_G$ of the defective combined pixel in which the pixel combining process has possibly been performed across the edge of the subject is, for example, the pixel signal of the pixel located over the edge of the subject. The pixel with the target correction value is also located over the edge of the subject and close to the defective combined pixel. In other words, the target correction value is the pixel signal of the normal combined pixel which does not require correction. For this reason, the correction is performed accurately by correcting the pixel signal through the interpolation along the edge as described above.

Note that in the case where the difference D between the first and second edge amounts $\Delta_Y$ and $\Delta_X$ is less than or equal to a given threshold value "0" (NO in S19), the edge extending in the X direction is not present in the proximity of the defective combined pixel. Therefore the pixel signal $Q_G$ is corrected properly by the normal gain correction or the normal interpolation correction (S16).

Figure 16:
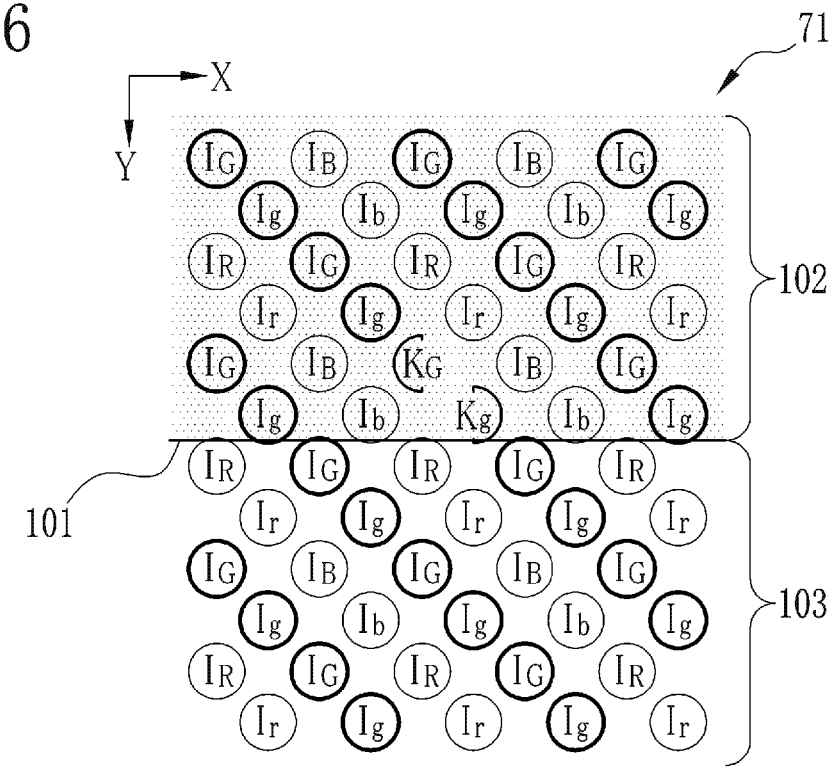
FIG. 16 is an explanatory view illustrating an arrangement of the pixels in a normal image in a case where an edge of a subject is parallel to the X direction.

An operation of the above correction is described with the use of a more specific example. As illustrated in FIG. 16, in the normal image data 71, an edge 101, which extends in the X direction, is located immediately below the defective pixels (the pixel signals $K_G$ and $K_g$). A subject having a region (hereinafter referred to as the dark region) 102, which is located above the edge 101 (upstream in the Y direction), and a region (hereinafter referred to as the bright region) 103, which is located below the edge 101 (downstream in the Y direction), is imaged. The sensitivity of each of the phase difference pixels 52a and 52b is half (½) the sensitivity of each of the normal pixels 51a and 51b. The value of each of the pixel signals $I_G$ and $I_g$ in the dark region 102 is "50". The value of each of the pixel signals $K_G$ and $K_g$ in the dark region 102 is "25". The value of each of the pixel signals $I_G$ and $I_g$ in the bright region 103 is "200". The value of each of the pixel signals $K_G$ and $K_g$ in the bright region 103 is "100".

Figure 17:
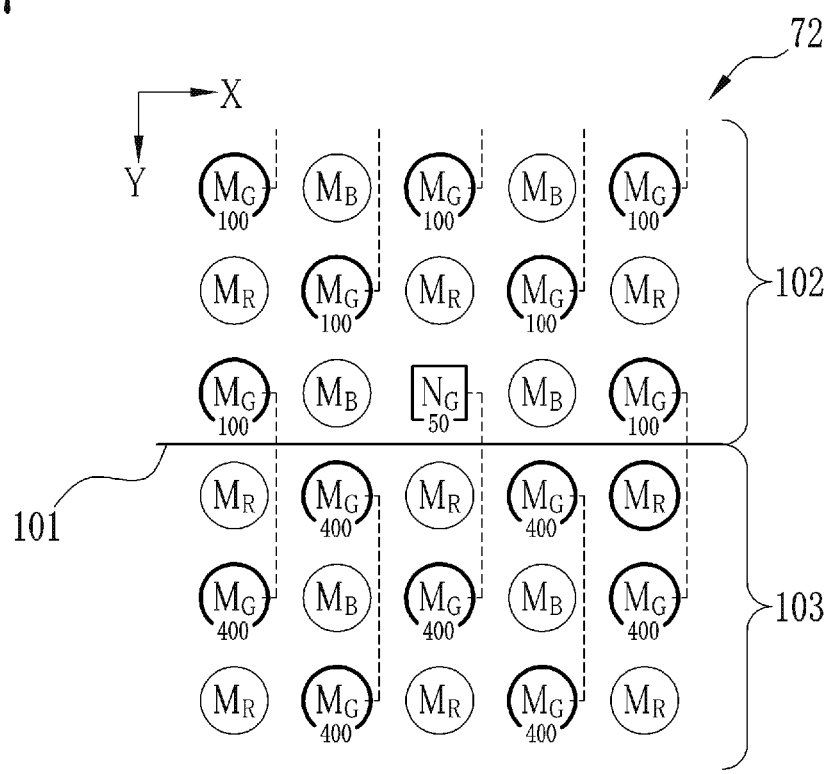
FIG. 17 is an explanatory view illustrating an arrangement of the pixels in the first composite image in the case where the edge of the subject is parallel to the X direction.

The first pixel combining process is performed on the normal image data 71 to generate the first composite image data 72. As illustrated in FIG. 17, the edge 101 of the subject is located immediately below the defective combined pixel (the pixel signal $N_G$) and parallel in the X direction. In the dark region 102, the value of the pixel signal $M_G$ is "100 (=50+50)". The value of the pixel signal $N_G$ is "50 (=25+25)". In the bright region 103, the value of the pixel signal $M_G$ is "400 (=200+200)". The value of the pixel signal $N_G$ (not shown) is "200 (=100+100)". In FIG. 17, the combined pixels which are connected by dotted lines are to be combined with each other in the second pixel combining process.

Figure 18:
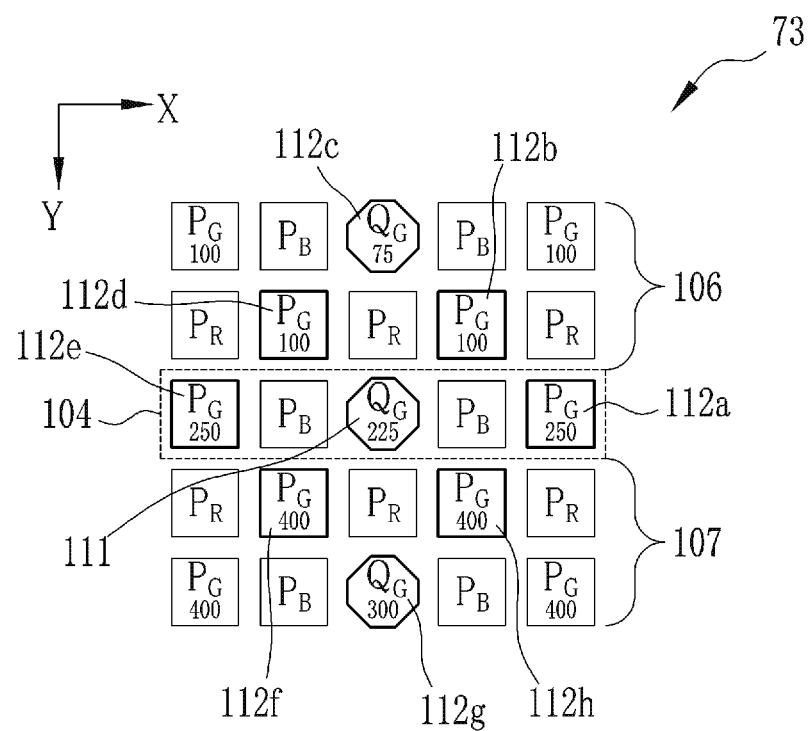
FIG. 18 is an explanatory view illustrating an arrangement of the pixels in the second composite image in the case where the edge of the subject is parallel to the X direction.

The second pixel combining process is performed on the first composite image data 71 to generate the second composite image data 73. Thereby, as illustrated in FIG. 18, the edge 101 of the subject is changed to a row (hereinafter referred to as the edge) 104 of the pixel signals which have been combined across the edge 101 through the second pixel combining process. A dark region 106 is located above the edge 104. A bright region 107 is located below the edge 104. In the case where the pixel signal of the second combined pixel, which is generated by the second pixel combining process, is calculated by averaging the two pixel signals, the value of the pixel signal $P_G$ is "100 (=(100+100)/2)" and the value of the pixel signal $Q_G$ is "75 (=(50+100)/2)" in the dark region 106. The value of the pixel signal $P_G$ is "400 (=(400+400)/2)" and the value of the pixel signal $Q_G$ is "300 (=(200+400)/2)" in the bright region 107. Furthermore, the value of the pixel signal $P_G$ is "250 (=(100+400)/2)" and the value of the pixel signal $Q_G$ is "225 (=(50+400)/2)", which are located over the edge 104.

A case in which a defective combined pixel 111 (pixel signal $Q_G$=225) located over the edge 104 in the middle of FIG. 18 is corrected by various methods is considered. First, in the case where the normal gain correction is performed, the ratio between the pixel signal $P_G$ and the pixel signal $Q_G$ in the dark region 106 is 4:3, and the ratio between the pixel signal $P_G$ and the pixel signal $Q_G$ in the bright region 107 is also 4:3. Accordingly, the gain γ calculated by the first calculator 86 is 4/3. The value of the gain-corrected pixel signal obtained by multiplying the pixel signal $Q_G$ of the defective combined pixel 111 by the gain γ is "300 (=225×4/3)".

However, the target correction value (the value corrected most accurately) of the pixel signal $Q_G$ of the defective combined pixel 111 is the same as the pixel value of a normal combined pixel 112a or 112e located over the edge 140, that is, "250". For this reason, after the gain correction, the defective combined pixel 111 becomes brighter than the adjacent pixels located over the edge 104. As a result, the trace of the correction is conspicuous.

In the case where the edge detector 88 detects the edge 104 with the use of the eight pixels 112a to 112h, which are located around the defective combined pixel 111, the first edge amount $\Delta_X$=0 because $\delta_{X1}$=|250−250|=0, $\delta_{X2}$=|100−100|=0, and $\delta_{X3}$=|400−400|=0. The second edge amount is $\Delta_Y$=825 because $\delta_{Y1}$=|75−300|=225, $\delta_{Y2}$=|100−400|=300, and $\delta_{Y3}$=|100−400|=300. The difference D between the first and second edge amounts $\Delta_Y$ and $\Delta_X$ is D=825−0=825>0. Therefore it is detected that the defective combined pixel 111 is located over the edge 104 that extends in the X direction.

The second calculator 87 determines the average value "250" of the pixel signals $P_G$ of the normal combined pixels 112a and 112e, which are closest to the defective combined pixel 111 in the left-right direction (X direction), to be the interpolation-corrected pixel signal. The correction method selector 89 replaces the pixel signal $Q_G$ of the defective combined pixel 111 with the interpolation-corrected pixel signal "250". Thereby the pixel signal $Q_G$ of the defective combined pixel 111 agrees with the target correction value and is corrected accurately.

Note that in the case where the pixel signal of the interpolation-corrected pixel signal is calculated using the pixel signal $P_G$ of each of the normal combined pixels 112a and 112e located on the left and the right of the defective combined pixel 111 and the pixel signal $P_G$ of each of the normal combined pixels 112b, 112d, 112f, and 112h located in the oblique directions in the proximity of the defective combined pixel 111, the value of the pixel signal is "250 (100+100+250+250+400+400)/6)". It seems as if the pixel signal $Q_G$ of the defective combined pixel 111 can be corrected by the normal interpolation correction. However, with regard to an actual subject, an error may be increased because the pixel signal $P_G$ of each of the pixels 112b and 112d in the dark region 106 and the normal combined pixels 112f and 112h in the bright region 107 is used for calculating the interpolation-corrected pixel signal. In the above-described interpolation correction performed along the edge 104, which extends in the first direction, the pixel signal of the defective combined pixel 111 located above the edge 104 is corrected in consideration of only the pixels located on the edge 104. As a result, the error is inhibited and more accurate correction is possible even in the case of the actual subject.

In the above embodiment, the pixel signal of the defective combined pixel of the second composite image data 73 is corrected by the conventional method (S16) in the case where the difference D between the first and second edge amounts $\Delta_Y$ and $\Delta_X$ is less than or equal to the given threshold value. However, in the case where the difference D between the first and second edge amounts $\Delta_Y$ and $\Delta_X$ is less than or equal to the threshold value and the condition (|Ca−Cg|>$C_{TH}$) described in S27 of FIG. 19 is satisfied, it is preferred to correct the pixel signal of the defective combined pixel by the gain correction.

Figure 19:
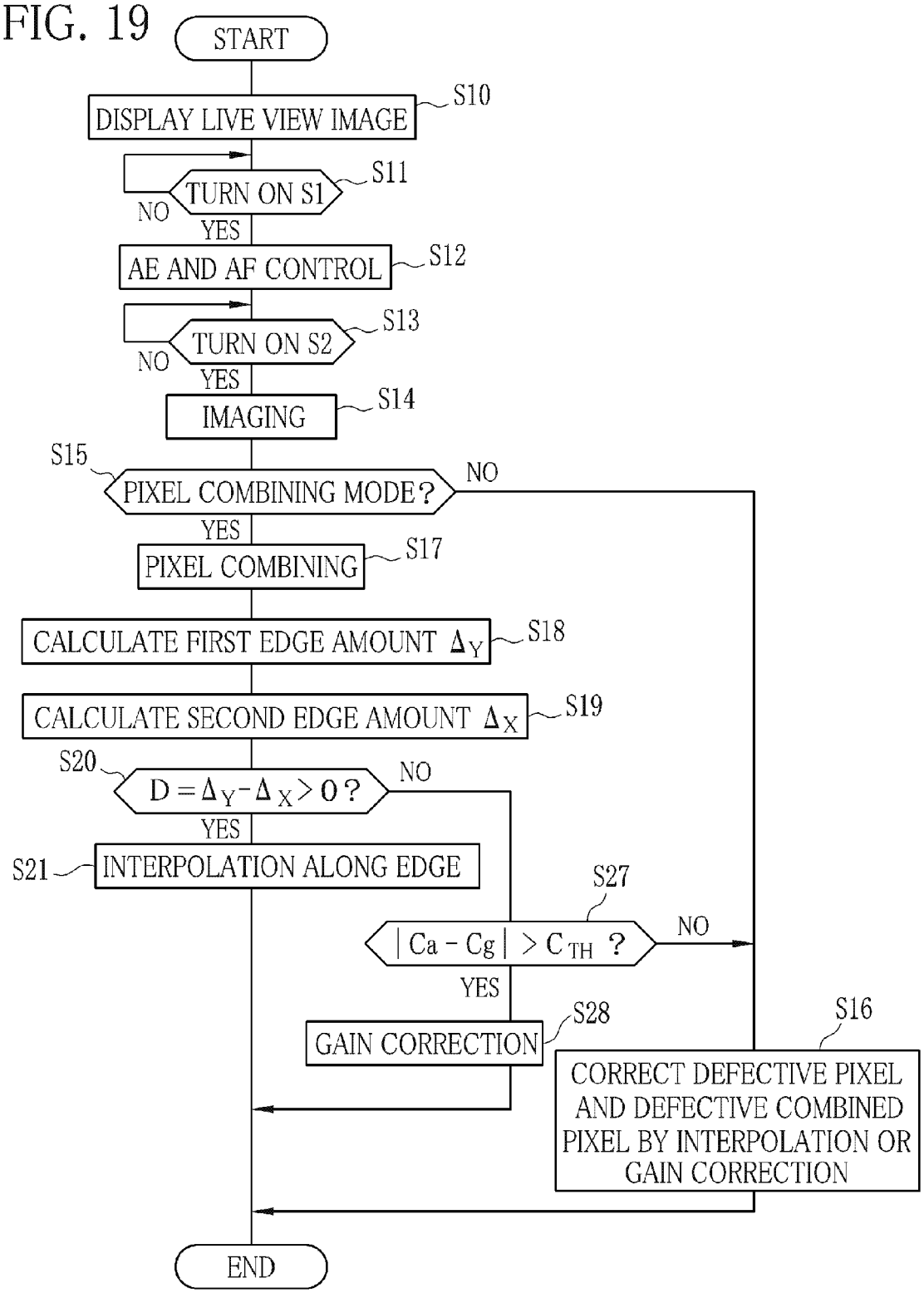
FIG. 19 is a flowchart illustrating steps for correcting the phase difference pixel or the defective combined pixel according to a modified example of the present invention.

As illustrated in FIG. 19, in the case where the difference D between the first and second edge amounts $\Delta_Y$ and $\Delta_X$ is less than or equal to the given threshold value (for example "0") (NO in S20), the magnitude of the difference |Ca−Cg| between the gain-corrected pixel signal Cg, which is calculated by the first calculator 86, and the interpolation-corrected pixel signal Ca, which is calculated by the second calculator 87, is calculated, and compared with the threshold value $C_{TH}$ (S27). In the case where the difference |Ca−Cg| between the gain-corrected pixel signal Cg and the interpolation-corrected pixel signal Ca is greater than the threshold value $C_{TH}$ (YES in S27), the pixel signal of the defective combined pixel is replaced with the gain-corrected pixel signal (S28).

As described above, in the case where the difference D between the first and second edge amounts $\Delta_Y$ and $\Delta_X$ is less than or equal to the threshold value, the gain-corrected pixel signal Cg is compared with the interpolation-corrected pixel signal Ca. In the case where the difference between the gain-corrected pixel signal Cg and the interpolation-corrected pixel signal Ca is large, the gain-corrected pixel signal Cg is used with higher priority. Thereby, the result of the correction is excellent in the case where a subject with thin vertical stripes is imaged.

Figure 20:
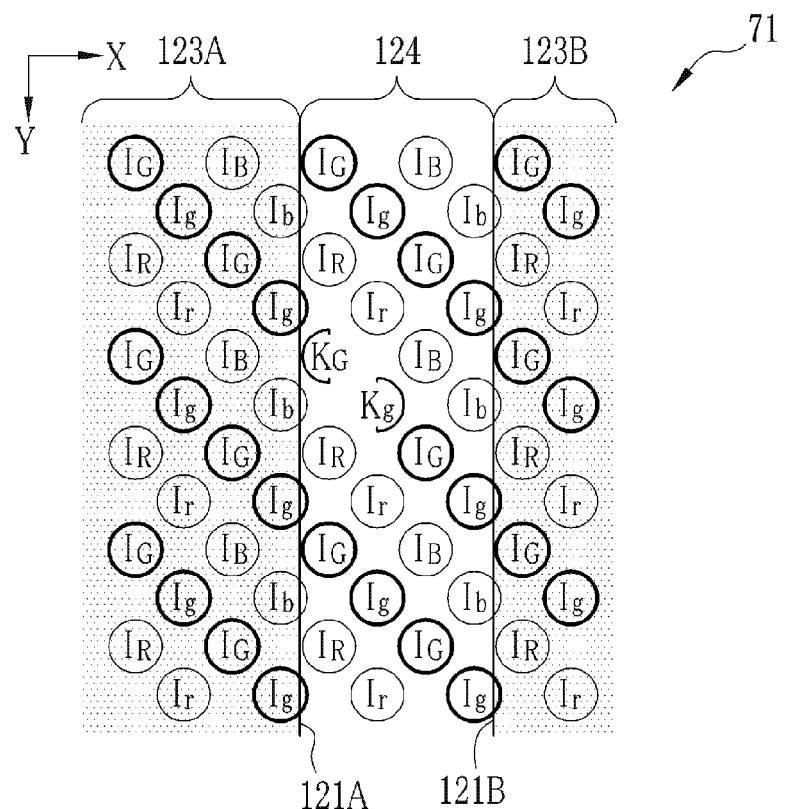
FIG. 20 is an explanatory view illustrating an arrangement of the pixels in a normal image in the case where a subject with vertical stripes is imaged.

As illustrated in FIG. 20, in the normal image data 71 obtained by imaging a subject with vertical stripes of a relatively short period, it is assumed that there are edges 121A and 121B, dark regions 123A and 123B, and a bright region 124. Suppose the sensitivity of each of the phase difference pixels 52a and 52b is half (½) the sensitivity of each of the normal pixels 51a and 51b. The value of the pixel signal $I_G$ or $I_g$ in the dark region 123A or 123B is "50". The value of the pixel signal $K_G$ or $K_g$ in the dark region 123A or 123B is "25". The value of the pixel signal $I_G$ or $I_g$ in the bright region 124 is "200". The value of the pixel signal $K_G$ or $K_g$ in the bright region 124 is "100".

Figure 21:
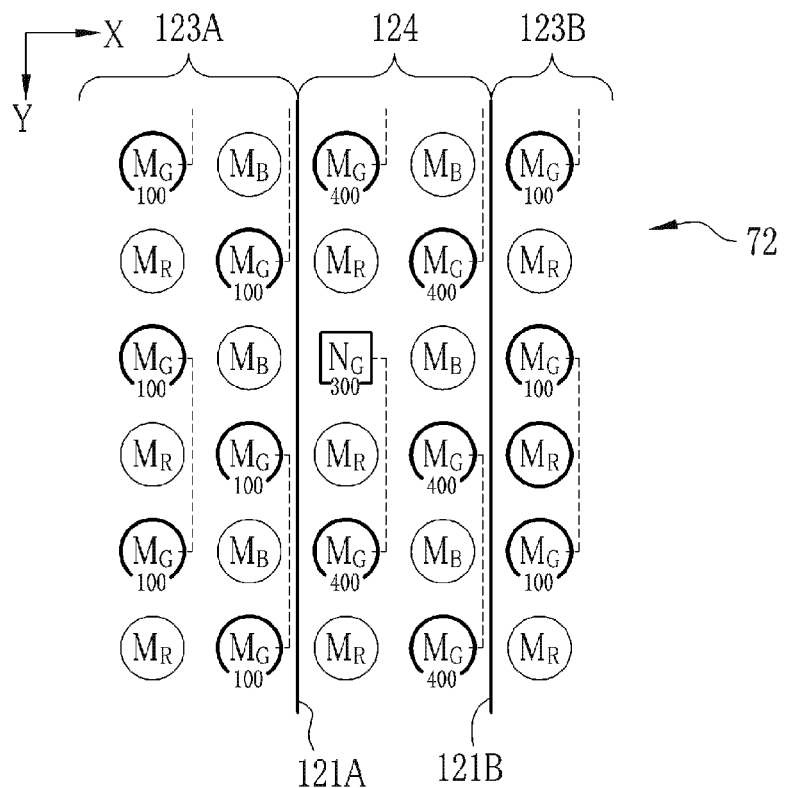
FIG. 21 is an explanatory view illustrating an arrangement of the pixels in a first composite image in the case where the subject with the vertical stripes is imaged.
Figure 22:
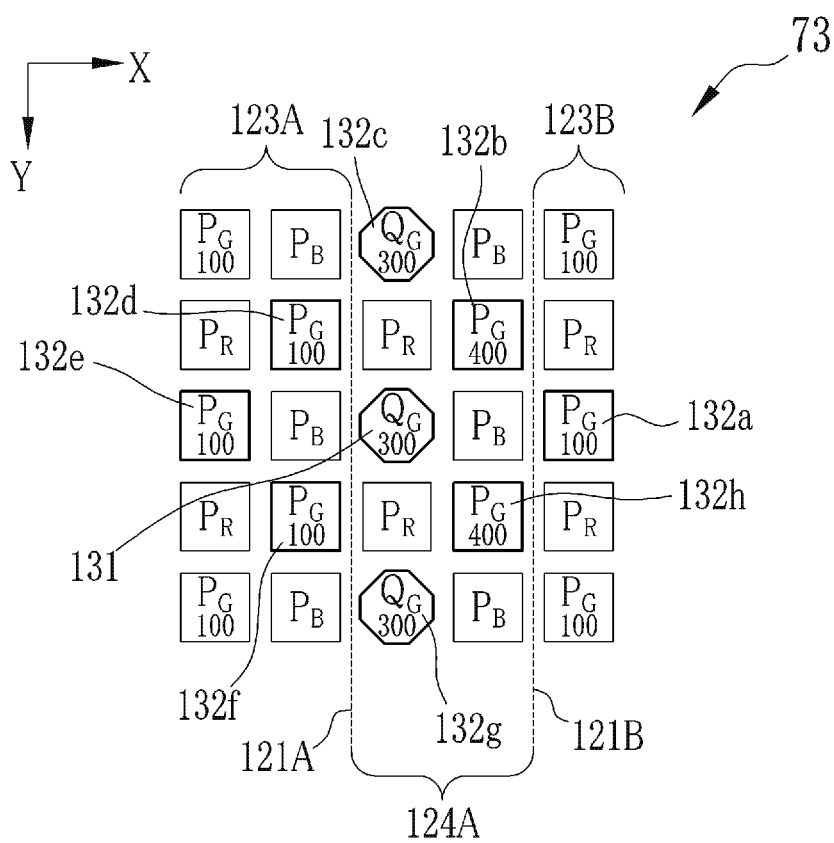
FIG. 22 is an explanatory view illustrating an arrangement of the pixels in a second composite image in the case where the subject with the vertical stripes is imaged.

In this case, as illustrated in FIG. 21, in the first composite image data 72, the value of the pixel signal $M_G$ is "100" and the value of the pixel signal $N_G$ is "50" (not shown) in the dark region 123A or 123B. The value of the pixel signal $M_G$ is "400" and the value of the pixel signal $N_G$ is "300" in the bright region 124. The pixel signals of the pixels connected by the dotted lines are those combined in the second pixel combining process, so that the pixel signals are not added across the edge 121A or 121B in the second pixel combining process. As illustrated in FIG. 22, in the second composite image data 73, the value of the pixel signal $P_G$ is "100" and the value of the pixel signal $Q_G$ is "75" (not shown) in the dark region 123A or 123B. The value of the pixel signal $P_G$ is "400" and the value of the pixel signal $Q_G$ is "300" in the bright region 124.

Next, a case in which the pixel signal $Q_G$ of defective combined pixel 131, which is located at the center in FIG. 22, is described. The value of the first edge amount $\Delta_X$ is "300" and the value of the second edge amount £ is "0", so that the difference D between the first and second edge amounts $\Delta_X$ and $\Delta_Y$ takes a negative value (D=−300<0). In this case, the first calculator 86 and the second calculator 87 calculate the gain-corrected pixel signal Cg and the interpolation-corrected pixel signal Ca, respectively.

First, with regard to the gain-corrected pixel signal Cg, the gain γ is 4/3 because the ratio between the pixel signal $P_G$ and the pixel signal $Q_G$ is 4:3 irrespective of the dark region 123A or 123B or the bright region 124A. Accordingly, the gain-corrected pixel signal Cg of the defective combined pixel 131 is "400". The interpolation-corrected pixel signal Ca is calculated based on the average value of the pixel signals $P_G$ of the normal combined pixels 132a, 132b, 132d to 132f, and 132h out of the combined pixels 132a to 132h, which are located around the defective combined pixel 131. For this reason, the value of the interpolation-corrected pixel signal Ca is "200".

The value of gain-corrected pixel signal Cg is twice the value of the interpolation-corrected pixel signal Ca, and the difference between them is "200". The target correction value of the pixel signal $Q_G$ of the defective combined pixel 131 in the bright region 124A is "400", which is the same as the pixel signal $P_G$ of the normal combined pixel in the bright region 124A. Therefore the gain correction allows accurate correction in the case where the subject with thin vertical stripes is imaged. In other words, the gain correction is set to be performed in the case where the difference between the gain-corrected pixel signal Cg and the interpolation-corrected pixel signal Ca is large, and thereby the result of the correction is excellent even if the subject with thin vertical stripes is imaged.

In the above embodiment, the color image sensor 26 is provided with the pixel combining circuit 46. In the case where imaging is performed in the pixel combining mode, the RAW image data in which the pixel signals are combined is outputted from the color image sensor 26. Instead, the pixel combining circuit 46 may be provided external to the color image sensor 26. For example, the pixel combining circuit 46 may be provided in the pixel signal processor 32. In this case, the color image sensor 26 always outputs the normal image data 71. The pixel signal processor 32 combines the pixel signals and corrects the pixel signals of the defective pixels and the defective combined pixels.

The pixel signal correction processor 81 is provided in the pixel signal processor 32, but the pixel signal correction processor 81 may be provided in the color image sensor 26. In this case, the color image sensor 26 may combine the pixel signals, and then the image data in which the pixel signals of the defective pixel and the defective combined pixel are corrected may be outputted as the RAW data in the case where the imaging is performed in the pixel combining mode.

The normal image data 71 or the first composite image data 72 may be used to detect the edge of the subject. In order to detect the edge based on the normal image data 71 or the first composite image data 72, a difference between the pixel signals in the X direction and a difference between the pixel signals in the Y direction are calculated and then compared with each other. Thereby the presence of the edge, which extends in the vertical direction with respect to the direction in which the difference between the pixel signals is at a maximum, is detected.

The edge detector 88 calculates the edge amounts $\Delta_X$ and $\Delta_Y$ in the two directions: the X direction and the Y direction. In addition, the edge detector 88 may calculate an edge amount in another direction such as an oblique direction. In other words, a direction in which the edge amount is calculated is arbitrary as long as the edge which is vertical to the direction of adding the pixel signals is detected in the second pixel combining process. In the case where the edge amounts are calculated in three or more directions, a method for calculating the edge amount in each direction is based on the above embodiment. In the case where the edge amounts are calculated in three or more directions, the edge amounts are compared with each other and a direction with the largest edge amount is detected. Thereby the presence of the edge which is vertical to the direction with the largest edge amount is detected.

In the case where imaging is performed in the pixel combining mode, the second composite image data 73, in which four pixel signals in total are combined with each other, is generated. The number of the pixel signals to be combined may be arbitrary. For example, the present invention is suitable for the case where two pixel signals are combined with each other as long as the pixel signal of the normal pixel is combined with the pixel signal of the phase difference pixel. Composite image data in which three or more pixel signals are combined with each other may be generated.

In the case where the defective pixel and the defective combined pixel are corrected through the interpolation, the average value of the pixel signals of the several pixels around the defective pixel or the like to be corrected is used as the interpolation-corrected pixel signal, but the specific methods for interpolation are arbitrary. For example, the interpolation-corrected pixel signal may be generated by polynomial or spline interpolation.

The pixels and the color filters in the color image sensor 26 are arranged in the so-called honeycomb EXR array, but the arrangements of the pixel and the color filters in the color image sensor are arbitrary as long as the composite image data is generated through the different pixel type combining process. For example, the present invention is suitable for the case where the phase difference pixels are provided in an image sensor of Bayer arrangement as long as the same pixel type combining process and the different pixel type combining process are performed to generate the composite image data.

The pixel signals of the obliquely adjacent pixels of the first pixel group and the second pixel group are combined with each other and then the two pixel signals of the same color in the Y direction are combined with each other by way of example. The combination of the pixel signals and the order of combining the pixel signals may be changed arbitrarily.

The pixel signals are added in the first pixel combining process and the pixel signals are averaged in the second pixel combining process, by way of example. To perform the pixel combining process through adding or averaging is determined arbitrarily. For example, the first pixel combining process may be performed through averaging the pixel signals. The second pixel combining process may be performed through adding the pixel signals.

Every fourth pixel in the X and Y directions in each of the first and second pixel group is the phase difference pixel 52a or 52b, but the arrangements of the phase difference pixels 52a and 52b in the image capture section 40 are arbitrary. The phase difference pixel 52a of the first pixel group is disposed next to the phase difference pixel 52b of the second pixel group by way of example. These pixels may not be disposed next to each other.

The color image sensor has three types of pixels, the B, G, and R pixels of three primary colors of the additive color system. Furthermore, a pixel of a special color, for example, skin color or the like may be added to use four or more types of pixels. Instead of the pixels of the three primary colors of the additive color system, the pixels of three primary colors of the subtractive color system, Y, M, and C may be used. The normal pixels of each color are provided but there is only one type of phase difference pixels, which correspond to the color G. However, there may be two or more types of phase difference pixels. For example, the phase difference pixels of the colors G, B, and R may be provided.

Note that the present invention is applicable to digital cameras, video cameras, and portable electronic devices (mobile phones, PDAs, smartphones, notebook computers, and the like) with camera functions.

Various changes and modifications are possible in the present invention and may be understood to be within the present invention.

What is claimed is:

1. An image capture device comprising:
   a color image sensor having a plurality of normal pixels and two or more phase difference pixels, the normal pixel isotropically receiving incident light, the phase difference pixel selectively receiving a part of the incident light;
   a pixel combining unit for performing a same type combining process, in which first pixel signals from the normal pixels of the same color or second pixel signals from the phase difference pixels of the same color are combined to generate a first combined signal, and a different type combining process, in which the first pixel signal and at least one of the second pixel signals of the same color are combined to generate a second combined signal, to produce a composite image, the composite image being composed of a first combined pixel that is based on the first combined signal and a second combined pixel that is based on the second combined signal;
   an edge detector for detecting an edge of a subject by detecting a first direction in which a difference between the first pixel signal and the second pixel signal of the same color or a difference between the first combined signal and the second combined signal of the same color is at a maximum, the edge being vertical to the first direction; and
   a corrector for correcting the second combined signal of the second combined pixel through an interpolation process using the first combined signal of the first combined pixel in a case where the different type combining process is performed across the edge, the first combined pixel being disposed in a second direction which is along the edge and vertical to the first direction, the first combined pixel having the same color as the second combined pixel to be corrected.

2. The image capture device according to claim 1, wherein there are at least three types of the normal pixels corresponding three primary colors, respectively, and there is at least one type of the phase difference pixels corresponding to one of the three primary colors.

3. The image capture device according to claim 2, wherein the corrector calculates an average value of the first combined signals of the first combined pixels and replaces the second combined signal of the second combined pixel to be corrected, with the average value, and the first combined pixels are disposed in the second direction which is along the edge and vertical to the first direction and have the same color as the second combined pixel to be corrected.

4. The image capture device according to claim 2, wherein the pixel combining unit generates the first combined signal through combining the four first pixel signals of the same color or the four second pixel signals of the same color in the same type combining process, and
   generates the second combined signal through combining four of the first and second pixel signals including at least a pair of the first and second pixel signals in the different type combining process.

5. The image capture device according to claim 2, wherein the pixel combining unit generates the first combined signal through combining the two first pixel signals of the same color or the two second pixel signals of the same color in the same type combining process, and
   generates the second combined signal through combining the one first pixel signal with the one second pixel signal in the different type combining process.

6. The image capture device according to claim 1, wherein the edge detector calculates the difference in each of a specific direction extending between the normal pixel for generating the first pixel signal and the phase difference pixel for generating the second pixel signal and another direction vertical to the specific direction, and the first pixel signal and the second pixel signal are combined in the different type combining process.

7. The image capture device according to claim 6, wherein, in order to calculate the difference, the edge detector uses the first combined signals of the first combined pixels disposed opposite to each other with respect to the second combined pixel to be corrected.

8. The image capture device according to claim 1, wherein the color image sensor has a first pixel group, in which the plurality of pixels are arranged in a square matrix, and a second pixel group, in which the plurality of pixels are arranged in a square matrix at the same arrangement pitch as the first pixel group, and
   the pixels in the second pixel group are disposed in positions obliquely shifted from positions of the pixels in the first pixel group, respectively, and
   the first pixel group and the second pixel group are provided with color filters of the same color arrangement.

9. The image capture device according to claim 8, wherein the phase difference pixel of the first pixel group and the phase difference pixel of the second pixel group are of the same color and adjacent to each other in an oblique direction.

10. The image capture device according to claim 9, wherein every fourth pixel in row direction and column direction of each of the square matrices is the phase difference pixel, and the normal pixel of the same color and the same pixel group as the phase difference pixel is disposed between the phase difference pixels.

11. The pixel correction method comprising the steps of:
imaging a subject with a color image sensor having a plurality of normal pixels and two or more phase difference pixels, the normal pixel isotropically receiving incident light, the phase difference pixel selectively receiving a part of the incident light;
performing a same type combining process, in which first pixel signals from the normal pixels of the same color or second pixel signals from the phase difference pixels of the same color are combined to generate a first combined signal, and a different type combining process, in which the first pixel signal and at least one of the second pixel signals of the same color are combined to generate a second combined signal, to produce a composite image, the composite image being composed of a first combined pixel that is based on the first combined signal and a second combined pixel that is based on the second combined signal;
detecting an edge of the subject by detecting a first direction in which a difference between the first pixel signal and the second pixel signal of the same color or a difference between the first combined signal and the second combined signal of the same color is at a maximum, the edge being vertical to the first direction; and
correcting the second combined signal of the second combined pixel through an interpolation process using the first combined signal of the first combined pixel in a case where the different type combining process is performed across the edge, the first combined pixel being disposed in a second direction which is along the edge and vertical to the first direction, the first combined pixel having the same color as the second combined pixel to be corrected.

* * * * *